(12) United States Patent
Kuboyama et al.

(10) Patent No.: US 7,576,583 B2
(45) Date of Patent: Aug. 18, 2009

(54) SINGLE-EVENT EFFECT TOLERANT LATCH CIRCUIT AND FLIP-FLOP CIRCUIT

(75) Inventors: Satoshi Kuboyama, Tsukuba (JP); Hiroyuki Shindou, Tsukuba (JP); Yoshiya Ilde, Tsukuba (JP); Akiko Makihara, Tsukuba (JP)

(73) Assignees: Japan Aerospace Exploration Agency, Tokyo (JP), part interest; High-Reliability Engineering & Components Corporation, Ibaraki (JP), part interest ( * ) Notice: Subject to any disclaimer, the term of this patent is extended or adjusted under 35 U.S.C. 154(b) by 209 days.

(21) Appl. No.: 11/638,189

(22) Filed: Dec. 12, 2006

(65) Prior Publication Data

US 2007/0132496 A1    Jun. 14, 2007

(30) Foreign Application Priority Data

Dec. 12, 2005    (JP)    ............................. 2005-357529

(51) Int. Cl.
*H03K 3/00*    (2006.01)
(52) U.S. Cl. ..................... 327/218; 327/202; 327/212
(58) Field of Classification Search ......... 327/201–203, 327/208, 212, 214, 218, 223, 224
See application file for complete search history.

(56) References Cited

U.S. PATENT DOCUMENTS 5,504,703 A * 4/1996 Bansal ....................... 365/156

6,327,176 B1    12/2001  Li et al.
6,683,932 B1 *  1/2004  Wood .......................... 377/47
6,696,873 B2 *  2/2004  Hazucha et al. ............. 327/203
6,696,874 B2    2/2004  Wood
2004/0017237 A1 1/2004  Wood

FOREIGN PATENT DOCUMENTS

JP    60-224319    11/1985
JP    06-006186    1/1994

* cited by examiner

*Primary Examiner*—Lincoln Donovan
*Assistant Examiner*—Hai L. Nguyen
(74) *Attorney, Agent, or Firm*—Blakely, Sokoloff, Taylor & Zafman LLP

(57) ABSTRACT

Disclosed are a latch circuit and a flip-flop circuit, which are capable of suppressing occurrence of a single-event effect, and, in the event of a single-event transient (SET), elimination adverse effects thereof on the circuit. The latch circuit comprises a dual-port inverter, and a dual-port clocked inverter including no transmission gate to reduce a region of strong electric field to be formed. A delay time is set up in a clock to eliminate adverse effects of the SET, and a leading-edge delayed clock to be entered into one of two storage nodes is generated in such a manner as to delay a transition of the storage node and the entire storage nodes from a latch mode to a through mode while preventing an increase in hold time due to the delay time.

34 Claims, 16 Drawing Sheets

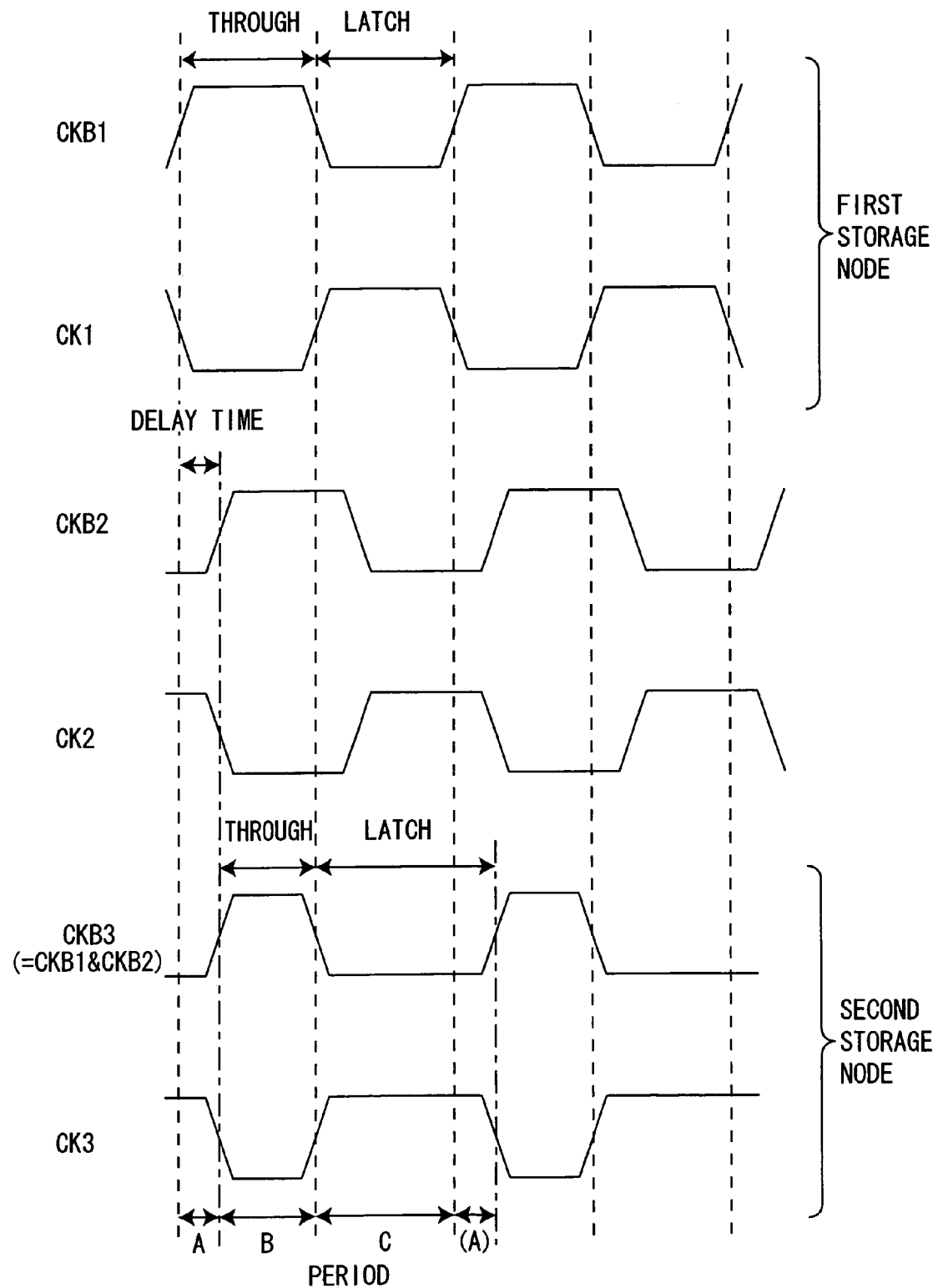

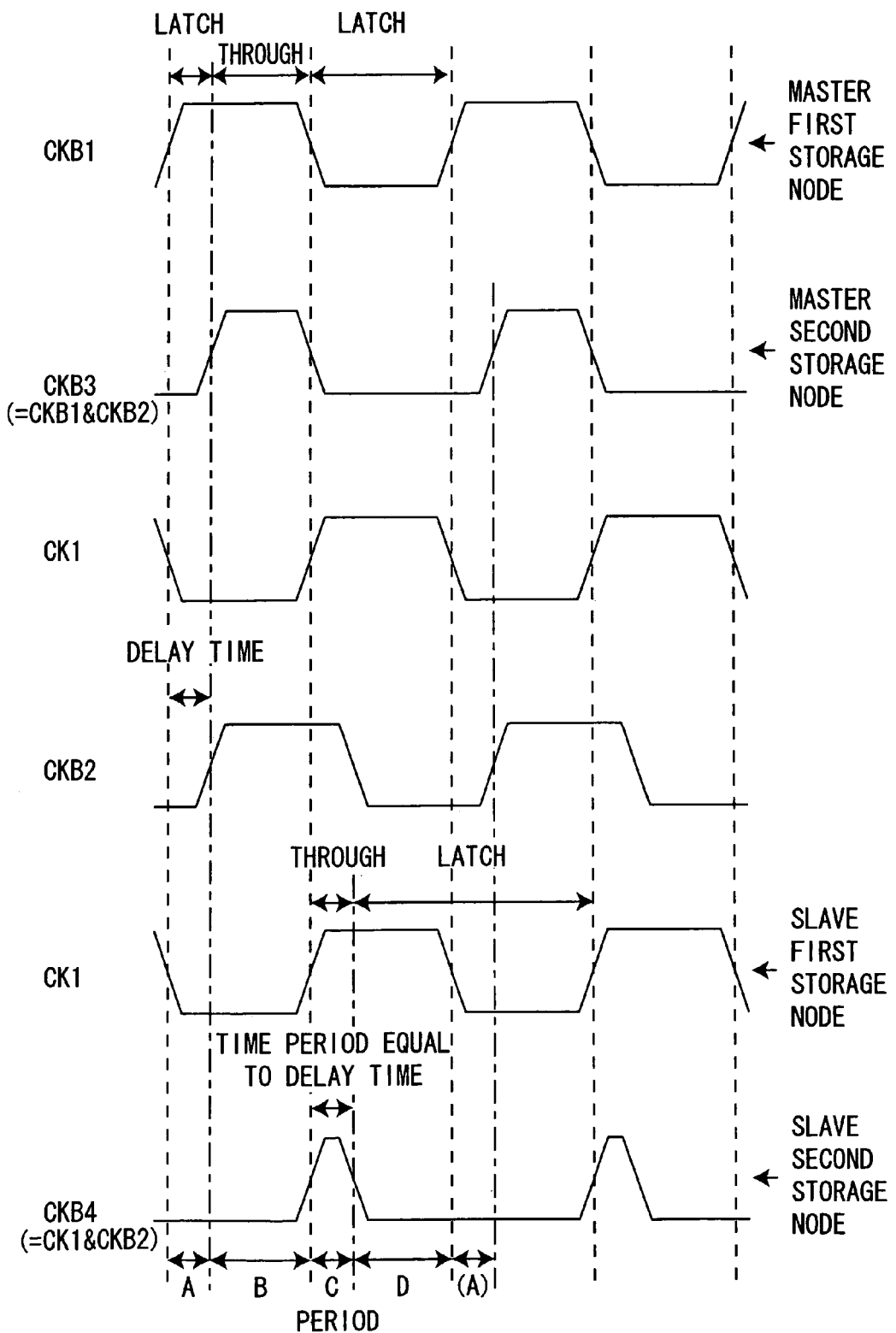

US 7,576,583 B2

SINGLE-EVENT EFFECT TOLERANT LATCH CIRCUIT AND FLIP-FLOP CIRCUIT

CROSS-REFERENCE TO RELATED APPLICATIONS

The present patent application claims priority from Japanese Patent Application No. 2005-357529, filed on Dec. 12, 2005.

TECHNICAL FIELD

The present invention relates to a latch circuit and a flip-flop circuit, and more specifically to a latch circuit and a flip-flop circuit which are tolerant to a single-event effect.

BACKGROUND ART

In an semiconductor device, such as a memory device including a flip-flop circuit, or a data latch circuit, if energetic particles, such as protons, neutrons or heavy ions, penetrate into a transistor as an element of the device, an electron-hole pair, i.e., excess opposite charges, is likely to be created in the element by the action of each energetic particle, such as ionization and excitation. The created electric charges are moved in opposite directions by an electric field in a reverse-biased PN junction region of the element (charge collection), and thereby the transistor in an OFF state is wrongly operated to temporarily have an ON state. Thus, a current which otherwise never occurs in a normal state will flow inside the semiconductor device to cause an error, such as inversion of data stored in the semiconductor device. This phenomenon is called "single-event upset" (SEU).

Such a malfunction due to penetration of energetic particles is also likely to occur in an external circuit connected to a clock signal input terminal or a data input terminal of a certain semiconductor device and cause an undesirable situation that the external circuit temporarily sends an abnormal clock signal or data signal to the semiconductor device. This current pulse which otherwise never occurs in a normal state is called "single-event transient current pulse", and such a phenomenon is called "single-event transient (SET)". The single-event transient current pulse applied to a semiconductor device is also likely to cause an error, such as inversion of data stored therein.

The phenomenon of occurrence of errors and defects in a semiconductor caused by incidence of energetic particles, such as the SEU and SET, is generally called "single-event effect (SEE)". A typical single-event effect (SEE) includes the SET to be caused by direct penetration of energetic particles into a semiconductor device, and the SEU to be caused by propagation of an abnormal single-event transient current pulse to the semiconductor device. The SEE is often observed in high altitude, cosmic space and radiation-related facilities, which are circumstances having a high probability of the presence of energetic particles, and regarded as one obstructive factor to a normal operation of a computer under such environments. It is not a realistic approach to try to fully shield such energetic particles in a mechanical manner so as to prevent the SEE. In other words, as effective measures against the SEE, it is essentially required to achieve a memory device tolerant to the SEE by itself.

In advance of the following description, the definition of each code to be used in this specification will be shown as follows:

CK: input clock signal to be entered from outside;
CKi: clock signal to be generated internally (with the same phase as that of input clock signal CK);
CKB: input inverted clock signal to be entered from outside;
CKBi: inverted clock signal to be generated internally (with the same phase as that of input inverted clock signal CKB);
D: input data signal to be entered from outside;
G: input clock signal to be entered from outside;
Gi: clock signal to be generated internally (with the same phase as that of input clock signal G);
GBi: inverted clock signal to be generated internally
MO: intermediate output signal to be sent from master to slave within flip-flop circuit;
Q: output data signal to be sent to outside;
QB: inverted output data signal to be sent to outside;
XQ: inverted output data signal to be sent to outside;
$V_{DD}$: source voltage from first voltage source; and
$V_{ss}$: source voltage [0 (zero) V] from second voltage source.

The clock signal is often used in such a manner as to be paired with the inverted clock signal generated by inverting the clock signal. This pair of the normal-phase and reversed-phase clock signal will be referred to as "complementary clock signals". Two clock signals whose codes are different in only the presence or absence of the suffix "B" representing "reversed phase" are the pair of complementary clock signals.

[Conventional Data Latch Circuit]

The configuration and operation of a conventional data latch circuit will be described below. FIG. 2 is a circuit diagram showing a conventional data latch circuit 1, and FIG. 1 is a circuit diagram showing a clock generation circuit 1C1 for the conventional data latch circuit 1. The clock generation circuit 1C1 comprises an inverter 1I1 adapted to invert an input. The clock generation circuit 1C1 is operable, based on an input clock signal G entered from outside as a clock signal, to generate an inversed clock signal GBi having a polarity opposite to that of the input clock signal G. The generated inversed clock signal GBi is supplied to the data latch circuit 1 together with the input clock signal G The inverter 1I1 comprises a p-channel MOS transistor 1P1 and an n-channel MOS transistor 1N1 which are connected in series with respect to a source or drain line in this order in a direction from a node connected to the side of a first voltage source ($V_{DD}$) to a node connected to the side of a second voltage source ($V_{ss}$).

In FIG. 2 which is a circuit diagram showing the conventional data latch circuit 1, a clocked inverter 1I3 and an inverter 1I4 makes up a storage node. An input data signal D is entered through a clocked inverter 1I2. The entered input data signal D is connected to the storage node.

As an output of the storage node, i.e., an output of the data latch circuit 1, an output of the clocked inverter 1I3 is sent out as an output data signal Q through a buffer circuit consisting of an inverter 1I5, and further an output of the inverter 1I4 is sent out as an output data signal XQ through a buffer circuit consisting of an inverter 1I6.

The clock generation circuit 1I1 illustrated in FIG. 1 is used in combination with the data latch circuit 1 to generate an inverted clock signal GBi to be entered into the data latch circuit 1. In the data latch circuit 1, when an input clock signal G is at a low level, an output data signal Q is sent out at the same logic level as that of an input data signal D (through mode or transparent mode). At a rise timing of an input clock signal G, an input data signal D is loaded from the clocked inverter 1I2 serving as an input stage of the data latch circuit 1, and latched. The latched data will be held during a period where the input clock signal G is at a high level (latch mode). Specifically, the latched data is held by the storage node consisting of the clocked inverter 1I3 and the inverter 1I4 which are cross-connected between respective outputs and inputs thereof. Then, the latched data will be sent out as an output data signal Q and an inverted output data signal XQ, respectively, from the inverter 1I5 and the inverter 1I6 each serving as a buffer circuit.

Now, the SEE will be discussed. As one example, given that a transistor of either one of the clocked inverter 1I3 and the inverter 1I4 which make up a storage node is changed from an OFF state to an ON state during the latch mode due to penetration of energetic particles. Thus, an output of the inverter including the affected transistor is shifted to an opposite logic level, and this change in logic value is entered into the other inverter to invert its output. Consequently, a logic value in the storage node is inverted to cause the SEU.

During the latch mode, the input-stage clocked inverter 1I2 as the input stage is kept in an OFF state to prevent an input data signal D from being transferred to a subsequent stage, and the storage-node clocked inverter 1I3 is kept in an ON state to store/hold a certain logic state. However, if a SET-induced voltage change which allows the input-stage clocked inverter 1I2 to be changed from the OFF state to the ON state is entered from an upstream, the input data signal D will be (inversed and) sent to the subsequent stage, and the storage-node clocked inverter 1I3 is changed to the OFF state to allow inversion of the logic state. In this timing, if the input data signal D has a logic level opposite to the logic state stored in the storage node, the stored data will be inverted to cause the SEE. As above, the conventional data latch circuit is extremely vulnerable to the SEE.

[Conventional Flip-Flop Circuit]

The configuration and operation of a conventional flip-flop circuit will be described below. FIG. 4 is a circuit diagram showing a conventional flip-flop circuit 2, and FIG. 3 is a circuit diagram showing a clock generation circuit 2C1 for the conventional flip-flop circuit 2. This flip-flop circuit 2 is a master-slave type D flip-flop. A clocked inverter 2I4 and an inverter 2I5 make up a pre-stage storage node, and a clocked inverter 2I6 and an inverter 2I7 make up a post-stage storage node. An input data signal D is entered through an inverter 2I3 serving as a buffer circuit. The entered input data signal D is connected to the pre-storage node via a transmission gate 2S1. The pre-stage storage node has an output connected to the post-storage node via a transmission gate 2S2. As an output of the post-stage storage node, i.e., an output of the flip-flop circuit 2, an output of the clocked inverter 2I6 is sent out as an inverted output data signal XQ through a buffer circuit consisting of an inverter 2I8 and an inverter 2I9, and further an output of the inverter 2I7 is sent out as an output data signal Q through a buffer circuit consisting of an inverter 2I10 and an inverter 2I11.

The clock generation circuit 2C1 illustrated in FIG. 3 is used in combination with the flip-flop circuit 2 to generate a clock signal CKi and an inversed clock signal CKBi. In the flip-flop circuit 2, when an input clock signal CK is at a low level, the clock signal CKi and the inversed clock signal CKBi are, respectively, at a low level and at a high level, and an input data signal D is loaded through the transmission gate 2S1 in an ON state. At the same time, the transmission gate 2S2 is in an OFF state, and thereby the input data signal D is not transferred from the transmission gate 2S2 to a subsequent stage. In this state, if the input clock signal CK is changed from the low level to a high level, the transmission gate 2S1 will be changed to an OFF state to preclude the input data signal D from being loaded into the flip-flop circuit 2. However, a logic state just before the change of the clock signal CKi to the high level is stored in the pre-stage storage node (master) consisting of the clocked inverter 2I4 and the inverter 2I5, and this stored logic state is transferred to the post-stage storage node (slave) via the transmission gate 2S2 which is changed to an ON state. In this timing, the clocked inverter 2I6 is in an OFF state, and thereby the post-stage slave does not store/hold the logic level in the storage node thereof. Therefore, the output transferred from the pre-stage master is sent out as an inverted output data signal XQ through the buffer circuit consisting of the inverter 2I8 and the inverter 2I9. Further, the output transferred from the pre-stage master is inverted by the inverter 2I7, and then sent out as an output data signal Q through the buffer circuit consisting of the inverter 2I10 and the inverter 2I11. Then, if the input clock signal CK is changed from the high level to the low level, the transmission gate 2S2 will be changed to the OFF state to preclude an output of the post-stage master from being transferred to the post-stage slave. At the same time, the clocked inverter 2I6 of the post-stage slave is changed to an ON state, and thereby the post-stage slave stores/holds a logic level just before the event. Thus, both the output data signal Q and the inverted output data signal XQ will be continuously sent out at the logic level just before the clock signal CKi is changed to a low level.

Now, the SEE will be discussed. As one example, given that, when the input clock signal CK is at the low level, and the post-stage slave of the flip-flop circuit 2 holds a certain logic level, a transistor of either one of the clocked inverter 2I6 and the inverter 2I7 which make up the post-stage storage node is changed from an OFF state to an ON state due to penetration of energetic particles.

Thus, an output of the inverter including the affected transistor is shifted to an opposite logic level, and this change in logic value is entered into the other inverter to invert its output. Consequently, a logic value in the storage node is inverted to cause the SEU.

In a state when the input clock signal CK is at the high level, the transmission gate 2S1 is kept in the OFF state to prevent an input data signal D from being transferred/entered to/into the pre-stage master, and the clocked inverter 2I4 of the pre-stage master is kept in an ON state to store/hold a certain logic state. However, if a SET-induced voltage change which allows the transmission gate 2S1 to be changed from the OFF state to an ON state is entered from an upstream, the input data signal D will be (inversed and) sent to the subsequent stage, and the clocked inverter 2I4 of the pre-stage master is changed to an OFF state to allow inversion of the logic state. In this timing, if the input data signal D has a logic level opposite to the logic state stored in the pre-stage storage node, the stored data will be inverted to cause the SEE. As above, the conventional flip-flop circuit is extremely vulnerable to the SEE.

[Conventional Single-Event Effect (SEE) Tolerant Device]

Heretofore, there has been known the following memory device with a configuration tolerant to the SEE (see, for example, the following Patent Publication 1). FIG. 6 is a circuit diagram showing a conventional SEE-tolerant data latch circuit 3. This data latch circuit 3 is also called "DICE (Dual Interlocked Storage Cell)". FIG. 5 is a circuit diagram showing a clock generation circuit 3C1 for the conventional data latch circuit 3. With reference to FIG. 6, the configuration of the data latch circuit 3 will be described below.

The data latch circuit 3 is a single-event upset (SEU) tolerant (hardened) latch circuit which generally comprises: a first dual-port inverter (3IP1) for receiving a first input (D), wherein the first input is coupled to the first dual-port inverter via a first set of pass gates (3S1 and 3S3); and a second dual-port inverter (3IP2) coupled to the first dual-port inverter (3IP1) via a second set of pass gates (3S2 and 3S4); and an output node connected to the first dual-port inverter (3IP1) and the second dual-port inverter (3IP2). In this data latch circuit 3, the coupling between the first dual-port inverter (31P1) and the second dual-port inverter (3IP2) is established by allowing an output of the second dual-port inverter (3IP2) to be coupled to the first dual-port inverter (3IP1) via the second set of pass gates (3S2 and 3S4).

The first dual-port inverter (3IP1) has the following configuration. The first dual-port inverter (3IP1) includes a first inverter (3I4) and a second inverter (3I6). The first inverter (3I4) includes a first transistor (3P6) connected in series to a second transistor (3N6), and the second inverter (3I6) includes a third transistor (3P10) connected in series to a fourth transistor (3N10). A gate of the first transistor (3P6) is connected to a gate of the fourth transistor (3N10) to provide a first inverter input node. A gate of the second transistor (3N6) is connected to a gate of the third transistor (3P10) to provide a second inverter input node. Further, the first and second transistors (3P6, 3N6) provide a first inverter output node, and the third and fourth transistors (3P10, 3N10) provide a second inverter output node. The first and second inverters (3I4, 3I6) are adapted to receive identical inputs to provide a valid output at either the first inverter output node or the second inverter output node. In this data latch circuit 3, as a first inverter output, an inverted output QB is provided to the first inverter output node. Each of the first and third transistors (3P6, 3P10) is a p-channel transistor, and each of the second and fourth transistors (3N6, 3N10) is an n-channel transistor.

The second dual-port inverter (3IP2) has the following configuration. The second dual-port inverter (3IP2) includes a first inverter (3I3) and a second inverter (3I5). The first inverter (3I3) includes a first transistor (3P3) connected in series to a second transistor (3N3), and the second inverter (3I5) includes a third transistor (3P7) connected in series to a fourth transistor (3N7). A gate of the first transistor (3P3) is connected to a gate of the fourth transistor (3N7) to provide a first inverter input node. A gate of the second transistor (3N3) is connected to a gate of the third transistor (3P7) to provide a second inverter input node. Further, the first and second transistors (3P3, 3N3) provide a first inverter output node, and the third and fourth transistors (3P7, 3N7) provide a second inverter output node. The first and second inverters (3I3, 3I5) are adapted to receive identical inputs to provide a valid at either the first inverter output node or the second inverter output node. Each of the first and third transistors (3P3, 3P7) is a p-channel transistor, and each of the second and fourth transistors (3N3, 3N7) is an n-channel transistor.

The data latch circuit 3 is adapted to suppress the SEE to some extent according to the following operations. As one example, given that the data latch circuit 3 is in a latch mode where an input clock signal CK is at a low level and an inversed clock signal is at a high level, wherein an input data signal D just before shift to the latch mode is at a low level, and this input data signal D is latched. In this state, an input and an output of the first dual-port inverter 3IP1 (inverter 3I4, inverter 3I6) are at a low level and at a high level, respectively. Further, an input and an output of the second dual-port inverter 3IP2 (inverter 3I3, inverter 3I5) are at a high level and at a low level, respectively. The SEE will occur when one of the transistors is changed from an OFF state to an ON state. In this example, given that the transistor 3N6 is changed from an OFF state to an ON state, and the output of the inverter 3I4 is temporarily changed to a low level. Further, given that, when both the transistors in each of the remaining inverters are in an ON state, a logic level of the output thereof is reversed in the same manner. The low level of the output from the inverter 3I4 is entered into the inverter 3I3 (transistor 3N3 includes therein) and the inverter 3I5 (transistor 3P7 includes therein). As to the inverter 3I3, the transistor 3N3 is changed from the ON state to an OFF state, and thereby all of the transistors in the inverter 3I3 have their OFF state. Thus, while the output node of the inverter 3I3 will have a high impedance state over time, the logic level just before the event can be maintained to some extent without being inversed. In this manner, the inverter 3I3 blocks from exerting influences of the SEE on a subsequent stage. As to the inverter 3I5, the transistor 3P7 is changed from the OFF state to an ON state, and thereby the output of the inverter 3I5 is reversed to have a high level.

After passing through the pass gate 3S4, the high level of the output from the inverter 3I5 is entered into the inverter 3I6 (transistor 3P10 includes therein) and the inverter 3I4 (transistor 3N6 includes therein). As to the inverter 3I6, the transistor 3P10 is changed from the ON state to an OFF state, and thereby all of the transistors in the inverter 3I6 have an OFF state. Thus, while the output node of the inverter 3I6 will have a high impedance state over time, the logic level just before the event can be maintained to some extent without being inversed. In this manner, the inverter 3I6 blocks from exerting influences of the SEE on a subsequent stage. As to the inverter 3I4, the input to the transistor 3N6 is inversed from a low level to a high level to exert an action of turning on the transistor 3N6. This action becomes a negative factor causing a worse situation than the initially assumed SEE. However, as mentioned above, there is the inverter, such as the inverter 3I3 and the inverter 3I6, where both the transistors thereof are turned off to allow the output node of the inverter to have a high impedance state so as to prevent influences of the SEE from being exerted on the subsequent stage. Thus, after termination of the SEE, the inverters will return to their original states. In this manner, even if either one of the transistors malfunctions, i.e., has an error, the SEE becomes unlikely to occur in the data latch circuit 3 in its entirety.

However, as the result of various experimental tests, it has been revealed that the SEE tolerance of the conventional data latch circuit 3 is not exactly sufficient. For example, when two or more of the transistors simultaneously malfunctioned due to penetration of energetic particles, the logical state of the storage node was inversed in some tests. Further, when a clock signal from the upstream was inversed due to the SET, the data latch circuit 3 in the latch mode was changed to the through mode to load an input data signal, and thereby stored data was inversed in some tests. As above, the reversion of an output due to the SEE was observed even in the data latch circuit 3 taking measures against the SEE. In view of significantly harmful effects of the SEE, it is desirable to maximize the tolerance to the SEE. Thus, there is the need for providing a semiconductor device, such as a memory device or a data latch circuit, with further enhanced SEE tolerance.

[Patent Publication 1] U.S. Pat. No. 6,327,176

DISCLOSURE OF THE INVENTION

In view of the above problems, it is an object of the present invention to provide a latch circuit and a flip-flop circuit with further enhanced SEE tolerance. This object is achieved by the present invention having the following features. According to a first aspect of the present invention, there is provided a single-event effect tolerant latch circuit comprising a dual-port inverter, and a dual-port clocked inverter including no transmission gate. Specifically, this single-event effect tolerant latch circuit comprises: a dual-port inverter (6IP1) having two input nodes for receiving a pair of inputs, and two output nodes, wherein the pair of inputs are coupled to the dual-port inverter, respectively, via a first transmission gate (6S1) and a second transmission gate (6S2); a dual-port clocked inverter (6IP2) having two input nodes coupled to the two output nodes of the dual-port inverter (6IP1), and two output nodes; and an output node connected to at least one of the two output nodes of the dual-port inverter (6IP1) and the two output nodes of the dual-port clocked inverter (6IP2).

In a specific embodiment, the dual-port inverter comprises two inverters. In a more specific embodiment, each of the inverters comprises a p-channel transistor and an n-channel transistor. In a more specific embodiment, each of the 1st and 3rd transistors (6P16, 6P20) is a p-channel transistor, and each of the 2nd and 4th transistors (6N16, 6N20) is an n-channel transistor. In a more specific embodiment, the two inverters provide two inverter input nodes. In a more specific embodiment, the two inverters provide two inverter output nodes. In a more specific embodiment, the two inverter input nodes are adapted to receive identical inputs. In a more specific embodiment, two parallel-connected inverters are additionally provided in an input stage. In a more specific embodiment, the dual-port clocked inverter (6IP2) comprises two clocked inverters. In a more specific embodiment, each of the clocked inverters comprises two p-channel transistor and two n-channel transistor. In a more specific embodiment, each of the 5th, 6th, 9th and 10th transistors (6P13, 6P14, 6P17, 6P18) is a p-channel transistor, and each of the 7th, 8th, 11th and 12th transistors (6N13, 6N14, 6N17, 6N18) is an n-channel transistor. In a more specific embodiment, the two clocked inverters provide two input nodes, and receive a pair of given complementary clock signals. In a more specific embodiment, the two clocked inverters provide two output nodes. In a more specific embodiment, the two inverter input nodes are adapted to receive identical inputs. In a more specific embodiment, one of two storage nodes is adapted to receive a leading-edge delayed clock for delaying a timing of shifting the specific storage node and the entire storage nodes from a latch mode to a through mode. In a more specific embodiment, the leading-edge delayed clock to be entered into the storage node is generated by subjecting a normal clock and a totally-delayed clock to a calculation using a given logic circuit. In a more specific embodiment, the delay time is 0.5 nanoseconds or more, and less than one-half of one cycle of the complementary clock signals. In a specific embodiment, a diagonal distance between the transistors is a given separation distance greater than a minimum diagonal distance in a layout where the diagonal distance is minimized. In a more specific embodiment, the given separation distance is 2.0 micrometers or more.

According to a second aspect of the present invention, there is provided a single-event effect tolerant flip-flop circuit comprising two dual-port inverters, and two dual-port clocked inverters including no transmission gate. Specifically, this single-event effect tolerant flip-flop circuit comprises: a first dual-port inverter (7IP1) having two input nodes for receiving a first pair of inputs, and two output nodes, wherein the first pair of inputs are coupled to the first dual-port inverter, respectively, via a first transmission gate (7S1) and a second transmission gate (7S2); a first dual-port clocked inverter (7IP2) having two input nodes coupled to the two output nodes of the first dual-port inverter (7IP1), and two output nodes; a second dual-port inverter (7IP3) having two input nodes for receiving a second pair of inputs, and two output nodes, wherein the second pair of inputs are coupled to the second dual-port inverter, respectively, via a third transmission gate (7S3) and a fourth transmission gate (7S4); a second dual-port clocked inverter (7IP4) having two input nodes coupled to the two output nodes of the second dual-port inverter (7IP3), and two output nodes; and an output node connected to at least one of the two output nodes of the second dual-port inverter (7IP3) and the two output nodes of the second dual-port clocked inverter (7IP4). The second pair of inputs coupled to the two input nodes of the second dual-port inverter (7IP3), respectively, via the third transmission gate (7S3) and the fourth transmission gate (7S4), are coupled to either the two output nodes of the first dual-port clocked inverter (7IP2).

In a specific embodiment, the dual-port inverter comprises two inverters. In a more specific embodiment, each of the inverters comprises a p-channel transistor and an n-channel transistor. In a more specific embodiment, each of the 1st and 3rd transistors (7P17, 7P21) is a p-channel transistor, and each of the 2nd and 4th transistors (7N17, 7N21) is an n-channel transistor. Further, each of the 5th and 7th transistors (7P27, 7P31) is a p-channel transistor, and each of the 6th and 8th transistors (7N27, 7N31) is an n-channel transistor. In a more specific embodiment, the two inverters provide two inverter input nodes. In a more specific embodiment, the two inverters provide provides two inverter output nodes. In a more specific embodiment, the two inverter input nodes are adapted to receive identical inputs. In a more specific embodiment, two parallel-connected inverters are additionally provided in an input stage and an intermediate stage. In a more specific embodiment, the dual-port clocked inverter comprises two clocked inverters. In a more specific embodiment, each of the clocked inverters comprises two p-channel transistor and two n-channel transistor. In a more specific embodiment, each of the 9th, 10th, 13th and 14th transistors (7P14, 7P15, 7P18, 7P19) is a p-channel transistor, and each of the 11th, 12th, 15th and 16th transistors (7N15, 7N14, 7N19, 7N18) is an n-channel transistor. Further, each of the 17th, 18th, 21st and 22nd transistors (7P24, 7P25, 7P28, 7P29) is a p-channel transistor, and each of the 19th, 20th, 23rd and 24th transistors (7N25, 7N24, 7N29, 7N28) is an n-channel transistor. In a more specific embodiment, the two clocked inverters provide two input nodes, and receive a pair of given complementary clock signals. In a more specific embodiment, the two clocked inverters provide two output nodes. In a more specific embodiment, the two inverter input nodes are adapted to receive identical inputs. In a more specific embodiment, one of two master storage nodes in is adapted to receive a leading-edge delayed clock for delaying a timing of shifting the storage node and the entire master storage nodes from a latch mode to a through mode. In a more specific embodiment, the leading-edge delayed clock to be entered into the master storage node is generated by subjecting a normal clock and a totally-delayed clock to a calculation using a given logic circuit. In a more specific embodiment, one of two slave storage nodes is adapted to receive a trailing-edge advanced clock for advancing a timing of shifting the slave storage node and the entire slave storage nodes from the latch mode to the through mode. In a more specific embodiment, the trailing-edge advanced clock shifts from the through mode to the latch mode at a timing just after a time period equal to the given delay time of the leading-edge delayed clock for the master storage node has elapsed from the timing of shifting from the latch mode to the through mode. In a more specific embodiment, the clock to be entered into the slave storage node is generated by subjecting a normal clock and a totally-delayed clock to a calculation using a given logic circuit. In a more specific embodiment, the given delay time is 0.5 nanoseconds or more, and less than one-half of one cycle of the complementary clock signals. In a specific embodiment, a diagonal distance between the transistors is a given separation distance greater than a minimum diagonal distance in a layout where the diagonal distance is minimized. In a more specific embodiment, the given separation distanceis 2.0 micrometers or more.

In the present invention, the term expressing each element in the appended claims, such as inverter, clocked inverter, dual-port inverter, dual-port clocked inverter or transistor, is not intended to limit it to a specific configuration/structure and a specific designation, but to express a general function of each claim element. Further, a function of a single claim element may be achieved by two or more components or devices, and a function of two or more claim elements may be achieved by a single component or device.

As above, in the present invention, the latch circuit comprises the dual-port inverter, and the dual-port clocked inverter including no transmission gate. Thus, as compared with a conventional latch circuit including a transmission gate, a region of strong electric field to be generated therein can be reduced to obtain an advantage of suppressing occurrence of the signal-event effect (SEE). Further, in the present invention, a specific one of two storage nodes is adapted to receive the leading-edge delayed clock allowing a timing of shifting the specific storage node and the entire storage nodes from the latch mode to the through mode to be delayed. This provides an advantage of eliminating an adverse effect of an associated on the latch circuit even if the single-event transition (SET) occurs, while preventing a hold time from being extended beyond the delay time set by the clock.

In the second aspect of the present invention, the flip-flop circuit comprises the two dual-port inverters, and the two dual-port clocked inverters including no transmission gate. Thus, as compared with a conventional flip-flop circuit including a transmission gate, a region of strong electric field to be generated therein can be reduced to obtain an advantage of suppressing occurrence of the SEE. Further, in the present invention, one of two master storage nodes is adapted to receive the leading-edge delayed clock for delaying a timing of shifting the master storage node and the entire master storage nodes from the latch mode to the through mode, and one of two slave storage nodes is adapted to receive the training-edge advanced clock for advancing a timing of shifting the slave storage node and the entire slave storage nodes from the through mode to the latch mode. Thus, even if the single-event transition (SET) occurs in an associated circuit, an adverse effect of the associated circuit on the flip-flop circuit can be eliminated. Further, even if two types of clock signals are used in the master storage nodes and the slave storage nodes at different timings, the above timing configuration can effectively prevent an increased in propagation delay time.

BRIEF DESCRIPTION OF DRAWINGS

FIG. 17 is a timing chart showing a clock signal for use in the data latch circuit 6.

FIG. 18 is a timing chart showing a clock signal for use in the flip-flop circuit 7.

BEST MODE FOR CARRYING OUT THE INVENTION

[Configuration of Dial-Port Inverter]

Figure 1:
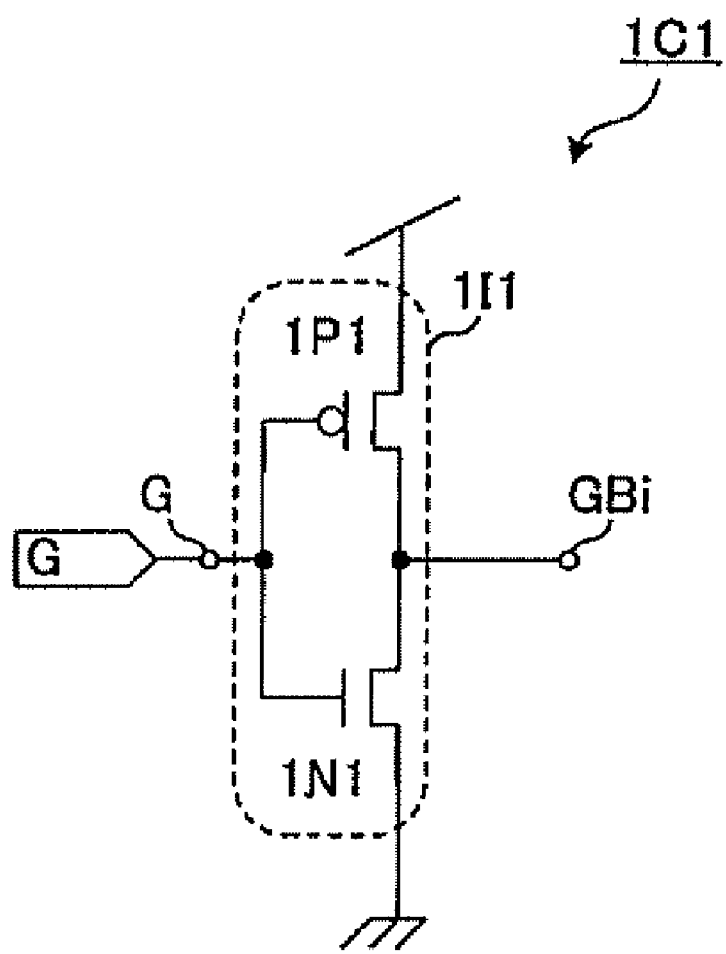
FIG. 1 is a circuit diagram showing a clock generation circuit 1C1 for a conventional data latch circuit 1.
Figure 2:
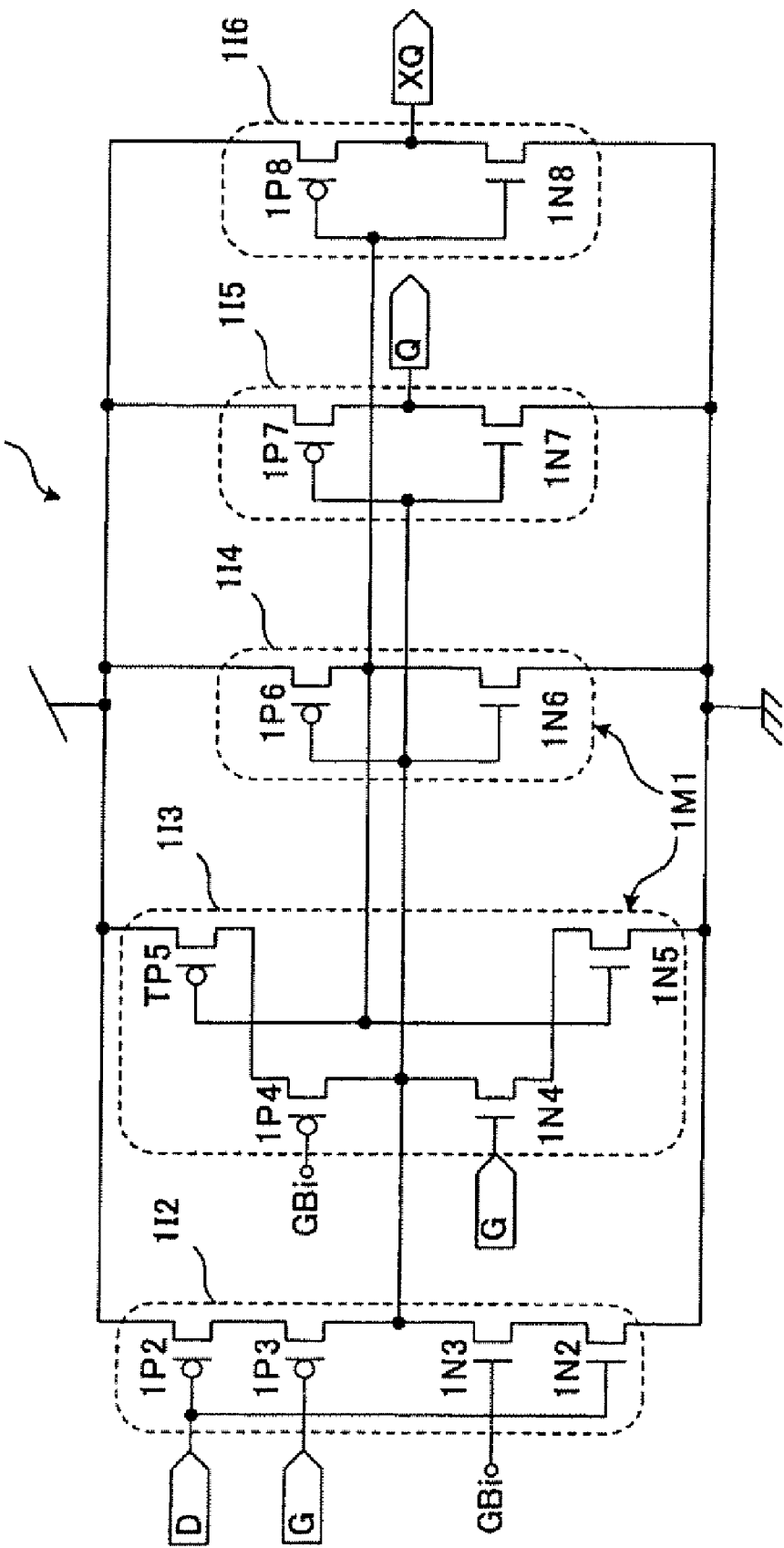
FIG. 2 is a circuit diagram showing the conventional data latch circuit 1.
Figure 3:
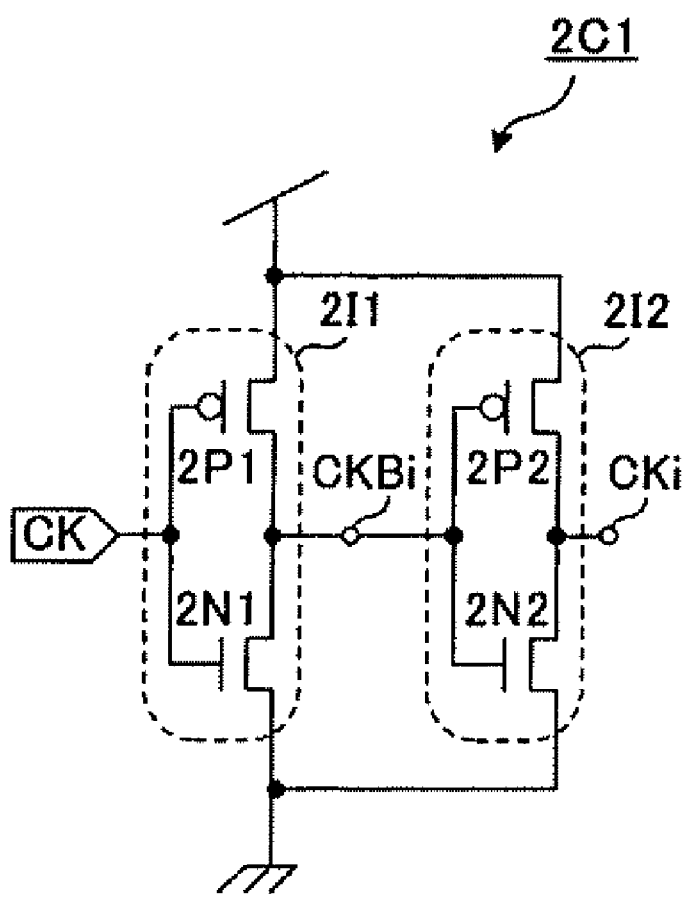
FIG. 3 is a circuit diagram showing a clock generation circuit 2C1 for a conventional flip-flop circuit 2.
Figure 4:
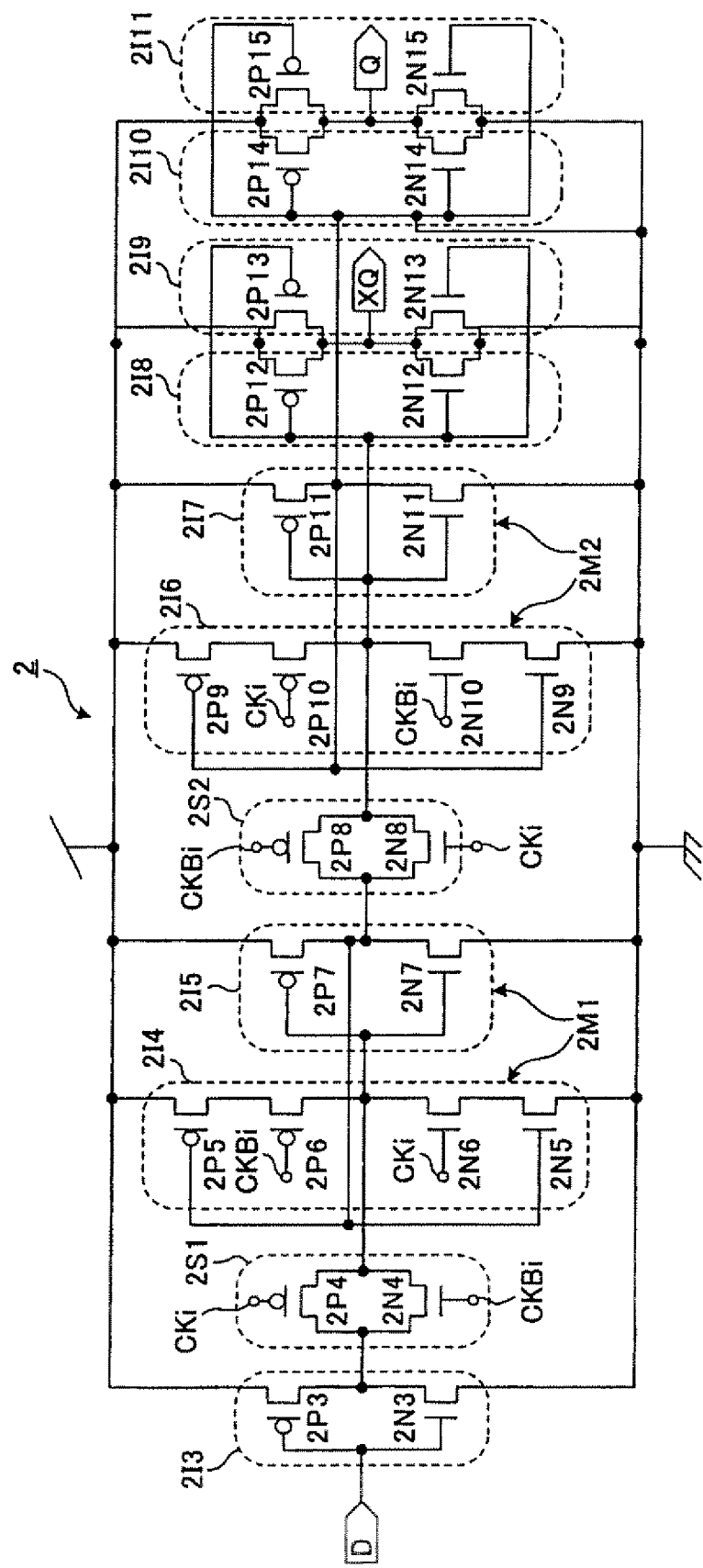
FIG. 4 is a circuit diagram showing the conventional flip-flop circuit 2.
Figure 5:
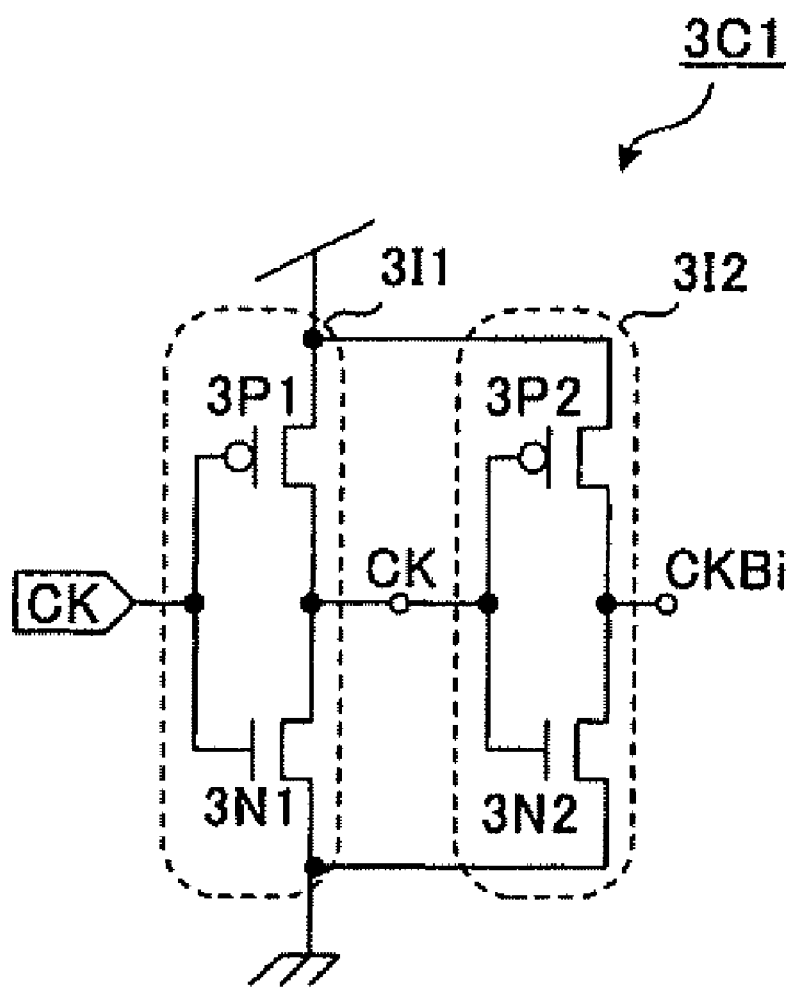
FIG. 5 is a circuit diagram showing a clock generation circuit 3C1 for a conventional SEE-tolerant data latch circuit 3.
Figure 6:
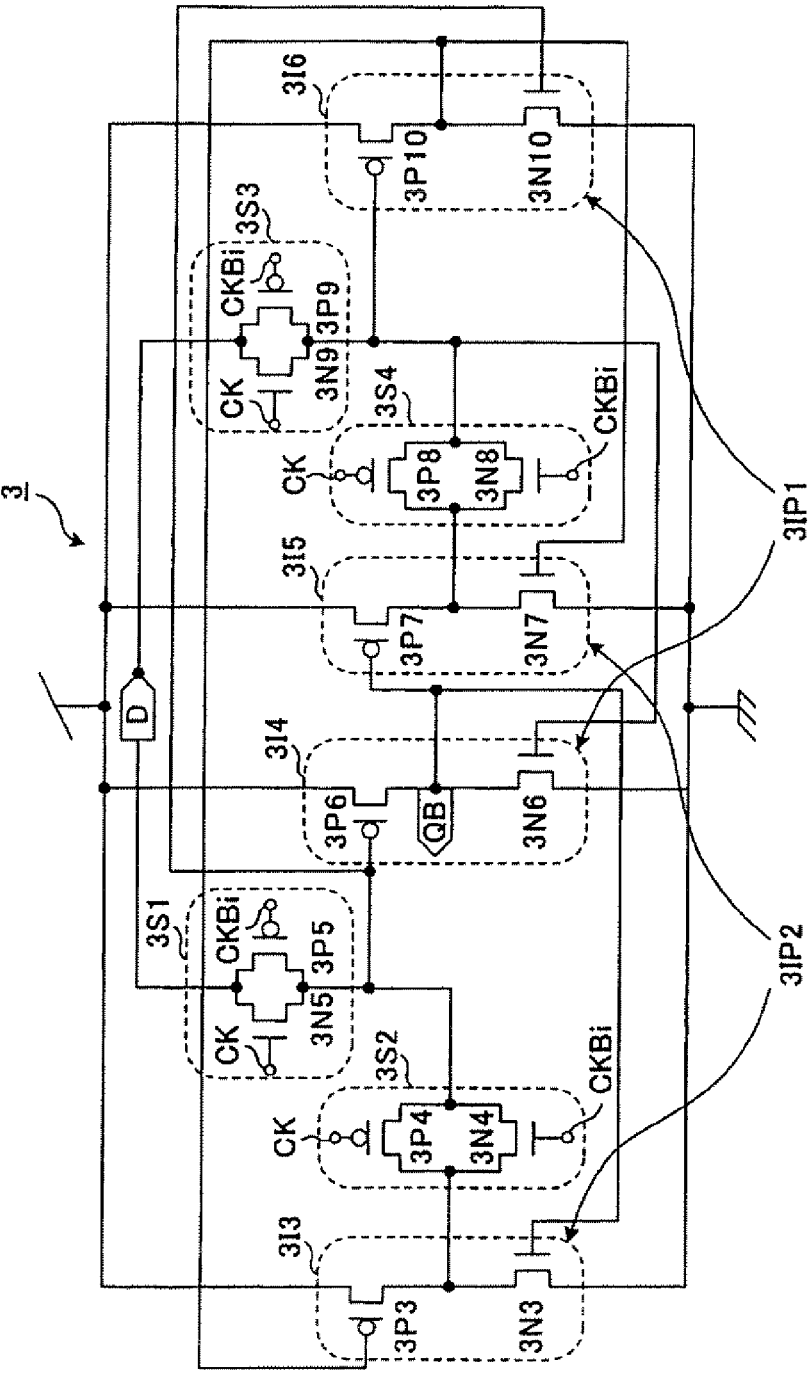
FIG. 6 is a circuit diagram showing the conventional SEE-tolerant data latch circuit 3.
Figure 7:
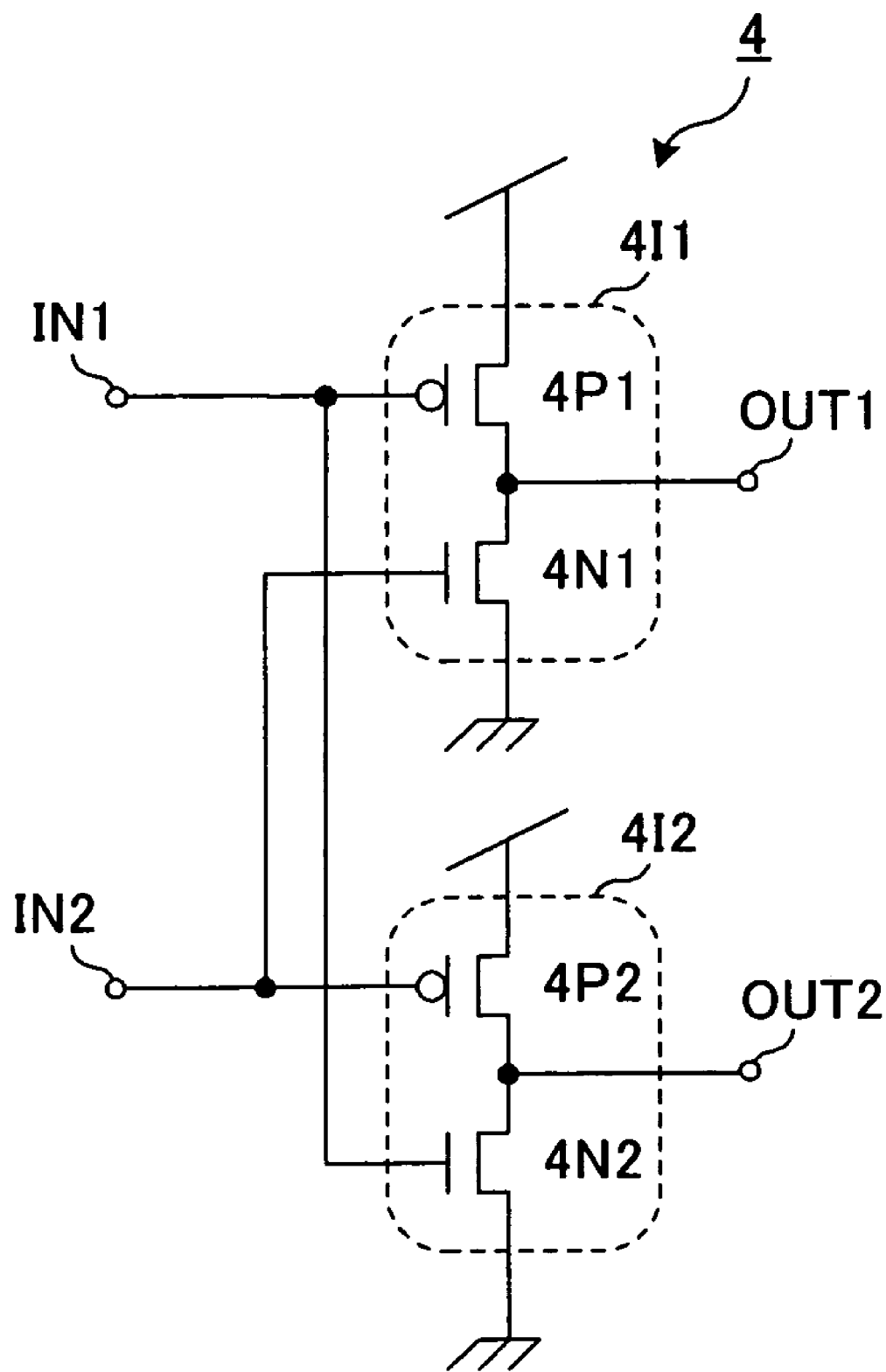
FIG. 7 is a circuit diagram showing the configuration of a dual-port inverter 4.

The present invention will now be described with reference to the circuit diagrams (FIGS. 7 to 16). First of all, a dual-port inverter 4 and a dual-port clocked inverter 5, which are basic units of a circuit of the present invention, will be described below. FIG. 7 is a circuit diagram showing the configuration of the dual-port inverter 4. The dual-port inverter 4 comprises a first inverter (4I1) and a second inverter (4I2). The first inverter (4I1) includes a 1st transistor (4P1) and a 2nd transistor (4N1) which are connected in series, and the first inverter (4I1) includes a 3rd transistor (4P2) and a 4th transistor (4N2) which are connected in series. A gate of the 1st transistor (4P1) is connected to a gate of the 4th transistor (4N2) to provide a first inverter input node 1N1, and a gate of the 2nd transistor (4N1) is connected to a gate of the 3rd transistor (4P2) to provide a second inverter input node 1N2. The 1st and 2nd transistors (4P1, 4N1) provide a first inverter output node OUT1, and the 3rd and 4th transistors (4P2, 4N2) provide a second inverter output node OUT2. The first inverter input node 1N1 and the second inverter input node 1N2 are adapted to receive identical inputs to provide a valid output at either the first inverter output node OUT1 or the second inverter output node OUT2. Each of the 1st and 3rd transistors (4P1, 4P2) is a p-channel transistor, and each of the 2nd and 4th transistors (4N1, 4N2) is an n-channel transistor.

The operation of the dual-port inverter 4 will be described below. The following Table 1 shows a logic operation of the dual-port inverter 4. As seen in Table 1, when the same logic level is entered into each of the first inverter input node 1N1 and the second inverter input node 1N2, an inverted logic level relative to the entered logic level is sent out from the first inverter output node OUT1 and the second inverter output node OUT2. Given that, due to occurrence of the SET in a preceding or upstream stage of the dual-port inverter 4, different logic levels are entered, respectively, into the first inverter input node 1N1 and the second inverter input node 1N2. In this case, as shown in Table 2, one of the first inverter output node OUT1 and the second inverter output node OUT2 has a high impedance state, and the other output node has an uncertain or indeterminate state. When the output node has a high impedance state, both the transistors of the inverter associated with such an output node are in an OFF state. Further, when the output node has an indeterminate state, both the transistors of the inverter associated with such an output node are in an ON state. In this case, either one of the output nodes inevitably has a high impedance state. When the output node has a high impedance state, a logic level in a circuit line connected thereto will be held to some extent. Thus, even if each of the first inverter input node 1N1 and the second inverter input node 1N2 has a different logic level due to the SET, the output node with a high impedance state can block from exerting influences of the SET on a subsequent stage thereof.

TABLE 1

| 1N1 | 1N2 | OUT1 | OUT2 |
|---|---|---|---|
| 0 | 0 | 1 | 1 |
| 1 | 1 | 0 | 0 |
| 1 | 0 | High Impedance | Indeterminate |
| 0 | 1 | Indeterminate | High Impedance |

[Configuration of Dual-Port Clocked Inverter]

Figure 8:
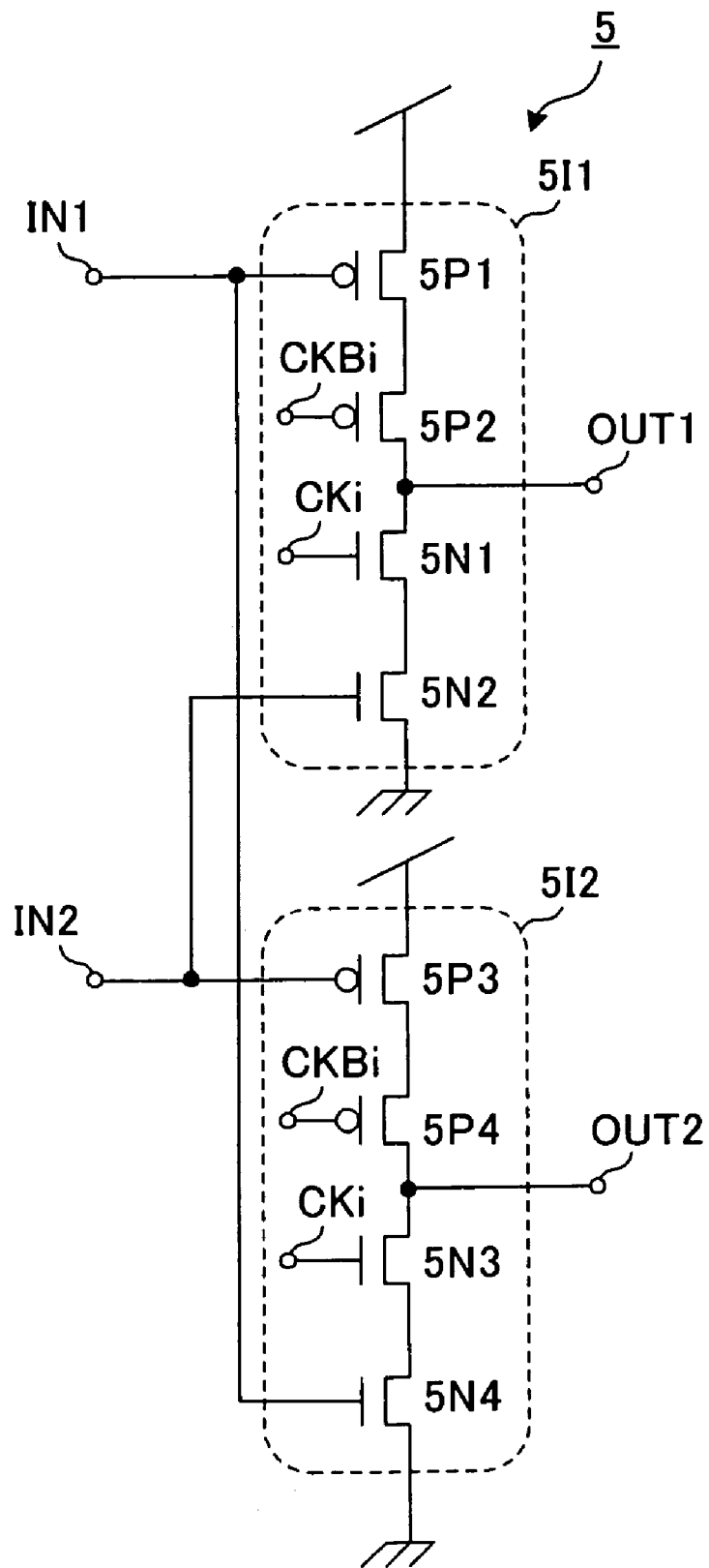
FIG. 8 is a circuit diagram showing the configuration of a dual-port clocked inverter 5.

FIG. 8 is a circuit diagram showing the configuration of the dual-port clocked inverter 5. The dual-port clocked inverter 5 comprises a first clocked inverter (5I1) and a second clocked inverter (5I2). The first clocked inverter (5I1) includes 1st, 2nd, 3rd and 4th transistors (5P1, 5P2, SN1, 5N2) which are connected in series in this order, and the second clocked inverter (5I2) includes 5th, 6th, 7th and 8th transistors (5P3, 5P4, 5N3, 5N4) which are connected in series in this order. A gate of either one (in this example, the 1st transistor 5P1) of the 1st and 2nd transistors (5P1, 5 P2) is connected to a gate of either one (in this example, the 8th transistor 5N4) of the 7th and 8th transistors (5N3, 5N4) to provide a first inverter input node 1N1. A gate of either one (in this example, the 4th transistor 5N2) of the 3rd and 4th transistors (5N1, 5N2) is connected to a gate of either one (in this example, the 5th transistor 5P3) of the 5th and 6th transistors (5P3, 5P4) to provide a second inverter input node 1N2. Each of a gate of the other (in this example, the 2nd transistor 5P2) of the 1st and 2nd transistors (5P1, 5P2) and a gate of the other (in this example, the 3rd transistor 5N1) of the 3rd and 4th transistors (5N1, 5N2) is adapted to receive a different one of a pair of complementary clock signals (CKBi, CKi) which are complementary to each other. Each of a gate of the other (in this example, the 6th transistor 5P4) of the 5th and 6th transistors (5P3, 5P4) and a gate of the other (in this example, the 7th transistor 5N3) of the 7th and 8th transistors (5N3, 5N4) is adapted to receive a different one of a pair of complementary clock signals (CKBi, CKi) which are complementary to each other. The 1st, 2nd, 3rd and 4th transistors (5P1, 5P2, 5N1, 5N2) provide a first inverter output node OUT1, and the 5th, 6th, 7th and 8th transistors (5P3, 5P4, 5N3, 5N4) provide a second inverter output node OUT2. The first inverter input node 1N1 the second inverter input node 1N2 are adapted to receive identical inputs to provide a valid output at either the first inverter output node OUT1 or the second inverter output node OUT2. Each of the 1st, 2nd, 5th and 6th transistors (5P1, 5P2, 5P3, 5P4) is a p-channel transistor, and the 3rd, 4th, 7th and 8th transistors (5NI, 5N2, 5N4) is an n-channel transistor. The complementary clock signals to be entered into each of the first clocked inverter (5I1) and the second clocked inverter (5I2) may be set at a different timing.

The operation of the dual-port clocked inverter 5 will be described below. As seen in the following Table 2, when, the complementary signal CKi has a logic level of "0 (low)", each of the first clocked inverter (5I1) and the second clocked inverter (5I2) is set in an OFF state, and thereby the output nodes have a high impedance state irrespective of a logic level in the first inverter input node 1N1 the second inverter input node 1N2. Thus, the dual-port clocked inverter 5 is operable to prevent an input entered therein from being transferred to the output nodes, and allow a logic level in a subsequent stage to be maintained. When the complementary signal CKi has a logic level of "1 (high)", each of the first clocked inverter (5I1) and the second clocked inverter (5I2) is set in an ON state to allow the dual-port clocked inverter 5 to generally perform the same operation as that of the aforementioned dual-port inverter 4.

TABLE 2

| CKi | 1N1 | 1N2 | OUT1 | OUT2 |
|---|---|---|---|---|
| 0 | 0 | 0 | High Impedance | High Impedance |
| 0 | 1 | 1 | High Impedance | High Impedance |
| 0 | 1 | 0 | High Impedance | High Impedance |
| 0 | 0 | 1 | High Impedance | High Impedance |
| 1 | 0 | 0 | 1 | 1 |
| 1 | 1 | 1 | 0 | 0 |
| 1 | 1 | 0 | High Impedance | Indeterminate |
| 1 | 0 | 1 | Indeterminate | High Impedance |

[Data Latch Circuit 6]

Figure 10:
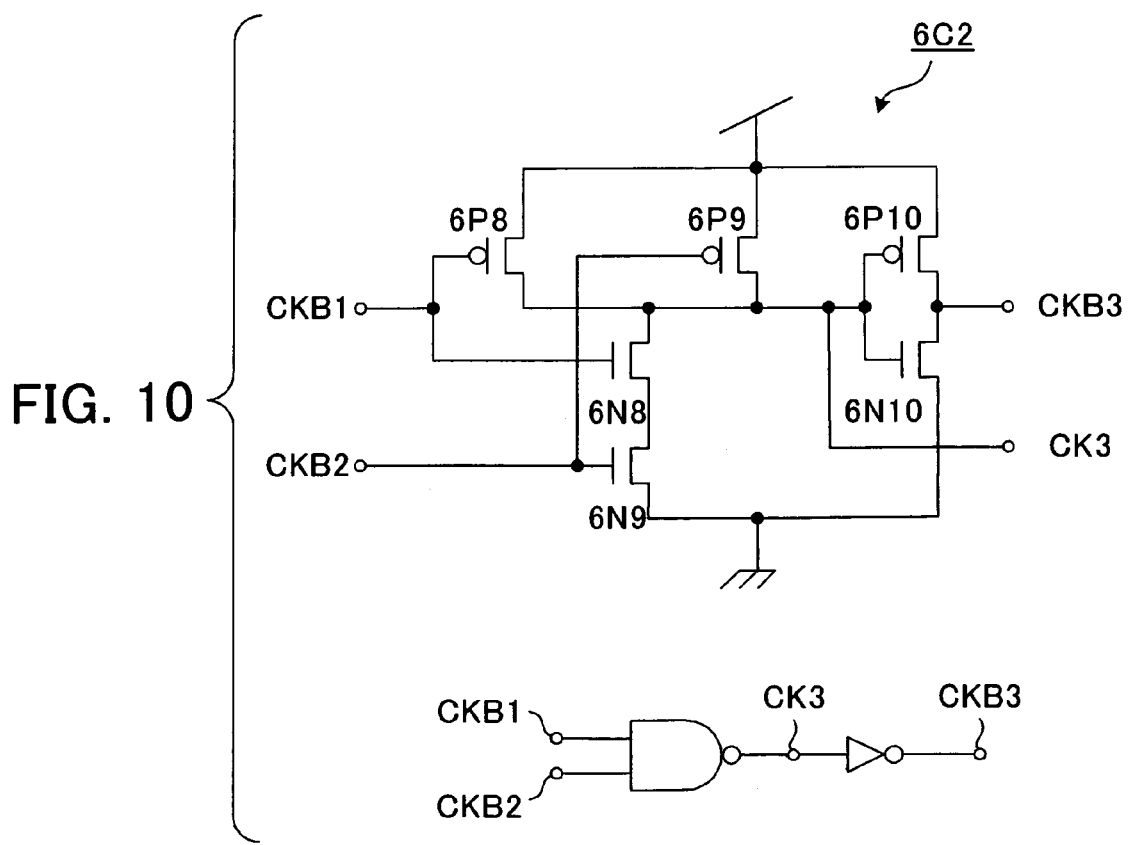
FIG. 10 is a circuit diagram showing a clock generation circuit 6C2 for a data latch circuit 6 according to a first embodiment of the present invention.
Figure 11:
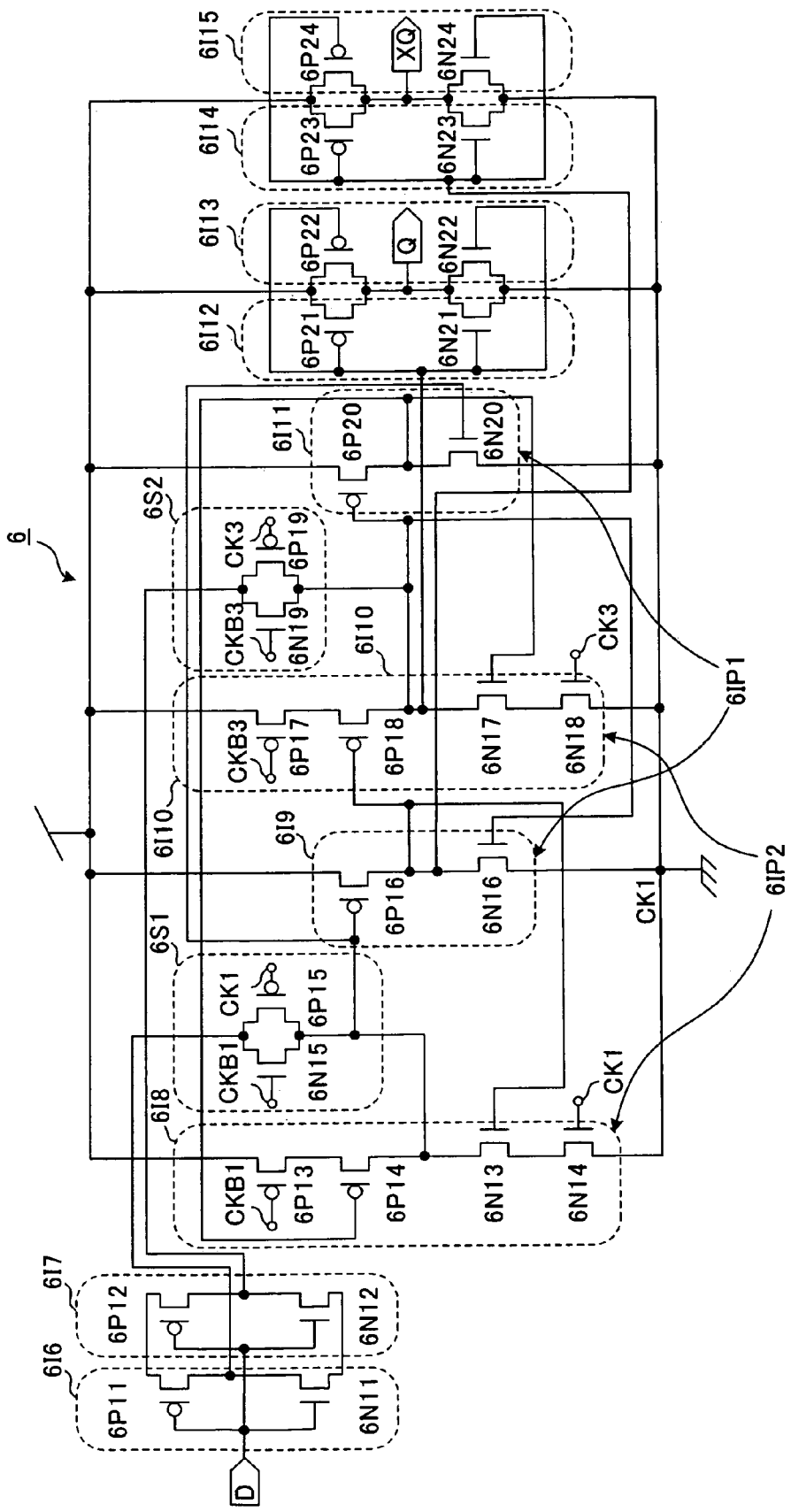
FIG. 11 is a circuit diagram showing the configuration of the data latch circuit 6 which comprises a dual-port inverter 6IP1 and a dual-port clocked inverter 6IP2, according to the first embodiment of the present invention.

With reference to the circuit diagrams (FIGS. 9 to 11) and the timing chart (FIG. 17), the configuration and operation of a data latch circuit 6 according to a first embodiment of the present invention will be described below. FIG. 11 is a circuit diagram showing the configuration of the data latch circuit 6 which comprises a dual-port inverter 6IP1 and a dual-port clocked inverter 6IP2, according to the first embodiment of the present invention.

[Configuration of Data Latch Circuit 6]

The data latch circuit 6 has a configuration comprising a dual-port inverter, and a dual-port clocked inverter including no transmission gate. Specifically, the data latch circuit 6 comprises: a dual-port inverter (6IP1) having two input nodes for receiving a pair of inputs, and two output nodes, wherein the pair of inputs are coupled to the dual-port inverter, respectively, via a first transmission gate (6S1) and a second transmission gate (6S2); a dual-port clocked inverter (6IP2) having two input nodes coupled to the two output nodes of the dual-port inverter (6IP1), and two output nodes; and an output node connected to at least one of the two output nodes of the dual-port inverter (6IP1) and the two output nodes of the dual-port clocked inverter (6IP2). The dual-port inverter (6IP1) has the same configuration as that of the aforementioned dual-port inverter 4, and the dual-port clocked inverter (6IP2) has the same configuration as that of the aforementioned dual-port clocked inverter 5.

The dual-port inverter (6IP1) has the following configuration. The dual-port inverter comprises two inverters. Specifically, the dual-port inverter (6IP1) includes a first inverter (6I9) and a second inverter (6I11). Each of the inverters comprises a p-channel transistor and an n-channel transistor. Specifically, the first inverter (6I9) includes a 1st transistor (6P16) and a 2nd transistor (6N16) which are connected in series, and the second inverter (6I11) includes a 3rd transistor (6P20) and a 4th transistor (6N20) which are connected in series. The two inverters provide two input nodes. More specifically, a gate of the 1st transistor (6P16) is connected to a gate of the 4th transistor (6N20) to provide a first inverter input node, and a gate of the 2nd transistor (6N16) is connected to a gate of the 3rd transistor (6P20) to provide a second inverter input node. Further, the two inverters provide two output nodes. Specifically, the 1st and 2nd transistors (6P16, 6N16) provide a first inverter output node, and the 3rd and 4th transistors (6P20, 6N20) provide a second inverter output node. The two inverter input nodes are adapted to receive identical inputs. Specifically, the first and second inverter input nodes are adapted to receive identical inputs to provide a valid output at either the first inverter output node or the second inverter output node. Each of the 1st and 3rd transistors (6P16, 6P20) is a p-channel transistor, and each of the 2nd and 4th transistors (6N16, 6N20) is an n-channel transistor.

The dual-port clocked inverter (6IP2) comprises two clocked inverters. Specifically, the dual-port clocked inverter (6IP2) includes a first clocked inverter (6I8) and a second clocked inverter (6I10). Each of the inverters comprises a p-channel transistor and an n-channel transistor. Specifically, the first clocked inverter (6I8) includes 5th. 6th, 7th and 8th transistors (6P13, 6P14, 6N13, 6N14) which are connected in series in this order, and the second clocked inverter (6I10) includes 9th, 10th, 11th and 12th transistors (6P17, 6P18, 6N17, 6N18) which are connected in series in this order. The two clocked inverters provide two input nodes, and receive given complementary clock signals. Specifically, a gate of either one of the 5th and 6th transistors (6P13, 6P14) is connected to a gate of either one of the 11th and 12th transistors (6N17, 6N18) to provide a third inverter input node. A gate of either one of the 7th and 8th transistors (6N13, 6N14) is connected to a gate of either one of the 9th and 10th transistors (6P17, 6P18) to provide a fourth inverter input node. Each of a gate of the other of the 5th and 6th transistors (6P13, 6P14) and a gate of the other of the 7th and 8th transistors (6N13, 6N14) is adapted to receive a different one of a pair of first complementary clock signals (CKB1, CK1) which are complementary to each other. Each of a gate of the other of the 9th and 10th transistors (6P17, 6P18) and a gate of the other of the 11th and 12th transistors (6N17, 6N18) is adapted to receive a different one of a pair of third complementary clock signals (CKB3, CK3) which are complementary to each other. The first transmission gate (6S1) includes a p-channel transistor (6P15) and an n-channel transistor (6N15) each having a gate adapted to receive a different one of the first complementary clock signals with polarities allowing the first transmission gate to be subjected to an on/off operation opposite to that of the first clocked inverter (6I8). The second transmission gate (6S2) includes a p-channel transistor (6P19) and an n-channel transistor (6N19) each having a gate adapted to receive a different one of the third complementary clock signals with polarities allowing the second transmission gate to be subjected to an on/off operation opposite to that of the second clocked inverter (6I10). In this embodiment, a node which receives the clock signal CK1 and the inversed clock signal CKB1 will be referred to as "first storage node", and a node which receives the clock signal CK3 and the inversed clock signal CKB3 will be referred to as "second storage node". Further, the two clocked inverters provide two output nodes. Specifically, the 5th, 6th, 7th and 8th transistors (6P13, 6P14, 6N13, 6N14) provide a third inverter output node, and the 9th, 10th, 11th and 12th transistors (6P17, 6P18, 6N17, 6N18) provide a fourth inverter output node. The two inverter input nodes are adapted to receive identical inputs. Specifically, the third and fourth inverter input nodes are adapted to receive identical inputs to provide a valid output at either the third inverter output node or the fourth inverter output node. Each of the 5th, 6th, 9th and 10th transistors (6P13, 6P14, 6P17, 6P18) is a p-channel transistor, and the 7th, 8th, 11th and 12th transistors (6N13, 6N14, 6N17, 6N18) is an n-channel transistor. In this manner, each of the inverters is double-structured to suppress malfunctions due to the SEE. While a combination of a dual-port inverter and a transmission gate can theoretically perform the same operation as that of a dual-port clocked inverter, a circuit configuration based on such a combination of a (dual-port) inverter and a transmission gate has an disadvantage that a strong electric field region is likely to be widely generated depending on a source/drain voltage level even when an transistor of the transmission gate is in an ON state, to cause susceptibility to the SEE. In a clocked inverter used as substitute for the above combination, as in the present invention, the strong electric field region can be reduced as compared with the inverter using a transmission gate to effectively obtained enhanced insusceptibility to the SEE.

Preferably, two parallel-connected inverters are additionally provided in an input stage of the data latch circuit 6. Specifically, the data latch circuit 6 further includes a third inverter (6I6), and a fourth inverter (6I7) having an input node interconnected to an input node of the third inverter. The third inverter (6I6) has an output node connected to the first inverter input node via the first transmission gate (6S1), and the fourth inverter (6I7) has an output node connected to the second inverter input node via the second transmission gate (6S2). Thus, an input data signal D can be connected to the first inverter (6I9) via the first transmission gate (6S1) and to the second inverter (6I11) via the second transmission gate (6S2). In each of the inverters (6I6, 6I7), no signal is transferred from the output node to the input node thereof. This prevents a malfunction occurring on a downstream side of one of the inverters from exerting influences on a downstream side of the other inverter. In this manner, the first and second inverters (6I9, 6I11) of the dual-port inverter (6IP1) are fully separated from each other to eliminate mutual influences through upstream nodes thereof so as to obtain further enhanced tolerance to the SEE.

Generally, it is believed that elements, such as transistors, to be included in a semiconductor logic circuit, are desirably arranged in high density in view of reduction in size and increase in processing speed. In a malfunction or error regarded as a problem as typified by α-radiation induced soft error, a particle causing such an error has low energy, and a region to be ionized to create electric charges causing the error is limited to an extremely small range. For example, even in a semiconductor based on the latest 90-nm process, there is no possibility that a single α-particle simultaneously causes an error in adjacent transistors. The reason is as follows. As a parameter indicative of how much a charged particle chargingly affects a substance, a linear energy transfer (LET) and a radius of an ionized region are typically used.

The linear energy transfer means energy per unit length to be lost along a track when an energized or charged particle penetrates through a substance. The lost energy is transferred to atoms of the substance to cause ionization. Consequently, a columnar-shaped ionized region is formed about the track of the particle, and a radius of the ionized region is a range to be subjected to an electrical influence. On the assumption that particle beams having the same linear energy transfer penetrate through several samples, and each of the sample has the same material composition and imparity concentration, the ionized area in each of the samples has the same radius. More specifically, a maximum value of the linear energy transfer, i.e., a unit energy amount to be given by an α-radiation, is about 0.6 MeV/(mg/cm$^2$), and a radius of the columnar-shaped ionized region to be created in a substance by the α-radiation has an extremely small value of about several ten nm in silicon. Thus, even in a semiconductor based on the latest 90-nm process, the ionized region having such a radius never simultaneously causes an error in adjacent transistors.

In view of the object of the present invention directed to provide enhanced tolerance to the SEE to be caused by energetic particles in cosmic space or the like, the most risky particle causing the error is a heavy ion, such as iron ion. A maximum value of the linear energy transfer in a particle beam of iron ion is about 32 MeV/(mg/cm$^2$) which is 50 times or more of that of an α-radiation, and a radius of the ionized region in a particle beam of iron ion has a significantly large value of about 1 μm (1000 nm) in silicon. Further, when the particle beam of iron ion obliquely penetrates through a semiconductor, a maximum value of the linear energy transfer will be increased to about 40 MeV/(mg/cm$^2$). Thus, a plurality of MOS transistors in a semiconductor device based on a typical process will be included in an ionized region created by a single particle beam of iron ion. This means that even if a semiconductor device is simply double-structured, two MOS transistors therein will have an error inevitably and simultaneously. For this reason, it is desirable to arrange the transistors of the data latch circuit 6 in spaced-apart relation to each other. Specifically, the data latch circuit 6 is preferably designed such that, in each combination of the inverter and the clocked inverter either one of which has an output node directly connected to an input node of the other, a diagonal distance from each of the p-channel and n-channel transistors included in the inverter to each of the n-channel and p-channel transistors in the clocked inverter is set at a given separation distance greater than a minimum diagonal distance in a layout where the diagonal distance is minimized. In such a combination, each of the adjacent transistors different in conductivity type has the same on/off operation in a steady state, and thereby the transistors in an OFF state are likely to simultaneously malfunction. In the above arrangement, the pair of transistors which are likely to cause inversion of a logic state in the data latch circuit 6 when being simultaneously subjected to the SET are spaced apart from each other by a relatively large diagonal distance. This makes it possible to significantly lower the possibility that the pair of transistors are simultaneously inversed due to a single penetration of energetic particles.

Specifically, a distance between each successive two of the transistor 6P14, the transistor 6N16, the transistor 6P18 and the transistor 6N20, and a distance between each successive two of the transistor 6N13, the transistor 6P16, the transistor 6N17 and the transistor 6P20, are preferably set at a given separation distance or more. A larger separation distance provides more enhanced SEE tolerance. More specifically, depending on a production process, a carrier density of a substrate and other factor, a desirable result could be obtained by setting the separation distance, for example, at 2.0 μm (micrometers) or more, or 2.9 μm or more.

[Clock Generation Circuit]

The following description will be made about a clock generation circuit. Each of a clock generation circuit 6C1 in FIG. 9 and a clock generation circuit 6C2 in FIG. 10 is used in combination with the data latch circuit 6 to generate the clock signals CK1, CKB1, CK3, CKB3 to be entered into the data latch circuit 6. FIG. 17 is a timing chart showing the clock signals for use in the data latch circuit 6.

Figure 9:
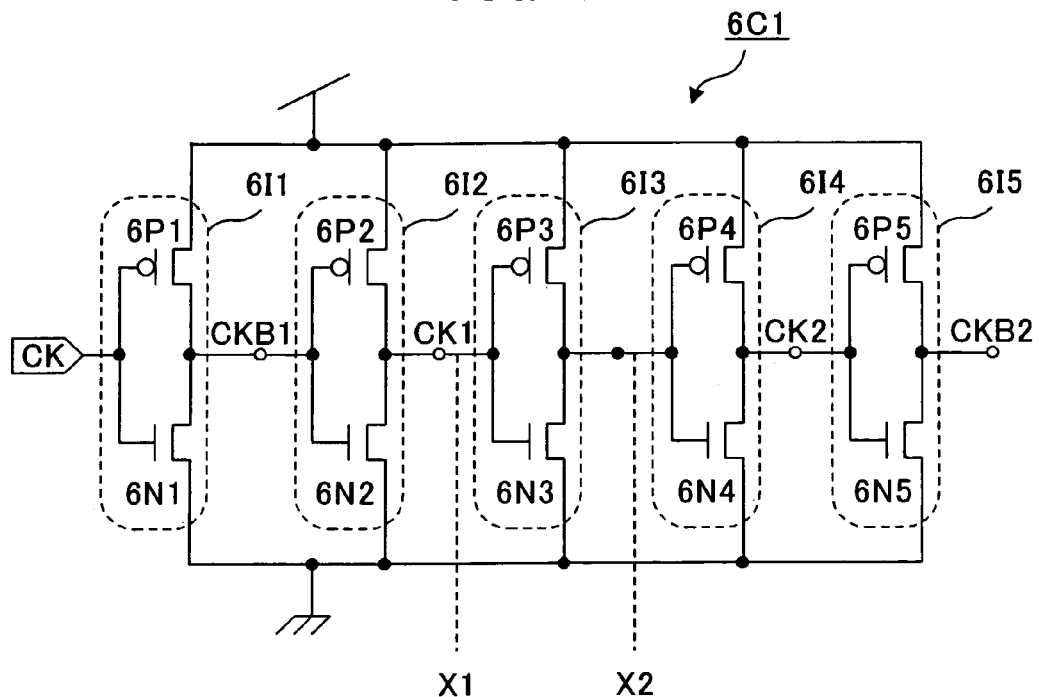
FIG. 9 is a circuit diagram showing a clock generation circuit 6C1 for a data latch circuit 6 according to the present invention.

As shown in FIG. 9, the clock generation circuit 6C1 is formed by connecting five inverters (6I1, 6I12, 6I3, 6I4, 6I5) in series. The clock generation circuit 6C1 is operable, based on an input clock signal CK entered thereinto, to generate an inversed clock signal CKB1, a clock signal CK1, a clock signal CK2 and an inversed clock signal CKB2. In this embodiment, a gate length of a transistor in the inverter 6I3 is formed to have a larger length than that in the remaining inverters to allow a given clock delay time to be obtained in a zone between X1 and X2 across the inverter 6I3 in FIG. 9. The transistor gate length in the inverter 6I3 is determined depending on the length of a required clock delay time. Specifically, for example, when the transistor gate length in the remaining inverters is 0.18 μm, the transistor gate length in the inverter 6I3 may be set at a value about several to several ten times greater than 0.18 μm. When a transistor gate length is increased, a voltage change becomes slower. Take the converse point of view, the gate length can be controlled to set the delay time at any value. Thus, the timing of the clock signal CK2 and the inversed clock signal CKB2 has a given delay time relative to that of the inversed clock signal CKB1 and the clock signal CK1. These timings are shown in FIG. 17. The timing of the clock signal CK2 and the inversed clock signal CKB2 is totally delayed by a time period indicated by "delay time" in FIG. 17.

A leading-edge delayed clock (clock signal CK3 and inversed clock signal CKB3) to be entered into one of two storage nodes is generated by subjecting a normal clock and a totally-delayed clock to a calculation using a given logic circuit. For example, the clock generation circuit 6C2 serving as such a logic circuit may be formed as a combination of an inverter and a transistor as shown in an upper portion of FIG. 10, to realize a logic circuit as shown in a lower portion of FIG. 10. The inversed clock signal CKB1 and the inversed clock signal CKB2 are entered into the clock generation circuit 6C2, and subjected to a NAND operation to generate the clock signal CK3. Then, the clock signal CK3 is inversed by the inverter to generate the inversed clock signal CKB3.

The combination of the clock generation circuit 6C1 and the clock generation circuit 6C2 can provide a clock signal having the following feature. Referring to FIG. 17, this combination is designed to generate a leading-edge delayed clock to be entered into one (second storage node) of two storage nodes so as to delay a timing of shifting the second storage node and the entire storage nodes from a latch mode to a through mode. In this specification, an edge of the clock corresponding to a timing when the storage node is shifted from the latch mode to the through mode will be referred to as "leading edge". Specifically, a rising edge of a positive-phase signal (CK3) in the third complementary clock signals which is adapted, when it is at a low level, to have a polarity allowing the second transmission gate (6S2) to be in an ON state, is set at the same timing as that of a rising edge of a positive-phase signal (CK1) in the first complementary clock signals which is adapted, when it is at a low level, to have a polarity allowing the first transmission gate (6S1) to be in an ON state. Further, a falling edge, i.e., leading edge, of the positive-phase signal (CK3) in the third complementary clock signals, is set at a delayed timing having a given delay time relative to a falling edge of the positive-phase signal (CK1) in the first complementary clock signals. The clock signal CK2 and the inversed clock signal CKB2 are intermediate signals for use in generating the clock signal CK3 and the inversed clock signal CKB3 to be entered into the data latch circuit 6. The relationship between these clock signals is shown in FIG. 17. While the timing of the falling edge, i.e., leading edge, of the clock signal CK3, is delayed from the falling edge of the clock signal CK1 by the given delay time, respective rising edges of these two clock signals are set at the same timing. While the rising edge, i.e., leading edge, of the inversed clock signal CKB3, is delayed from the rising edge of the inversed clock signal CKB1 by the given delay time, respective falling edges of these two clock signals are set at the same timing.

The positive-phase signal (CK3) and the negative-phase signal (CKB3) in the third complementary clock signals are generated, respectively, by a NAND operation and an AND operation of the negative-phase signal (CKB1) in the first complementary clock signals (CK1, CKB1) and the negative-phase signal (CKB2) in the second complementary clock signals (CK2, CKB2) which are generated by delaying the first complementary clock signals by the given delay time in its entirety.

In this embodiment, each of the first transmission gate (6S1) and the second transmission gate (6S2) is adapted to receive a different clock signal. Specifically, the clock signal CK1 and the inversed clock signal CKB1 are entered into the first transmission gate (6S1), and the clock signal CK3 and the inversed clock signal CKB3 are entered into the second transmission gate (6S2). Further, each of the first clocked inverter (6I8) and the second clocked inverter (6I10) in the dual-port clocked inverter (6IP2) is adapted to receive a different clock signal. Specifically, the clock signal CK1 and the inversed clock signal CKB1 are entered into the first clocked inverter (6I8), and the clock signal CK3 and the inversed clock signal CKB3 are entered into the second clocked inverter (6I10). In this manner, a timing of a specific operation in one of the double-structured circuits can be delayed. In this case, two storage nodes are formed of respective halves having the same clock signal timing in the double-structured circuits, wherein one of the storage nodes which receives the clock signal CK1 and the inversed clock signal CKB1 is defined as a first storage node, and the other storage node which receives the clock signal CK3 and the inversed clock signal CKB3 is defined as a second storage node. Thus, even if an erroneous input is made due to the SET, data in the first and second storage nodes can be protected from being changed, in the period where mismatching between the clock signals of the first and second storage nodes is caused by the delay.

If the entire operational timing of either one of the double-structured circuits is simply changed, a certain problem will occur. For example, a problem to be caused by entering the clock signal CK2 instead of the clock signal CK3 or entering the inversed clock signal CKB2 instead of the inversed clock signal CKB3 will be discussed. Referring to FIG. 17, as compared with the clock signal CK3 and the inversed clock signal CKB3 where a delay time is set, respectively, at only the timings of the falling edge and the rising edge, each of the clock signal CK2 and the inversed clock signal CKB2 is delayed over the entire waveform thereof. In this case, a propagation delay time between an input clock signal CK and an output data signal Q, or a propagation delay time as a delay time between an input of an input clock signal CK and output of a corresponding inversed output data signal XQ, will be increased by the setup delay time. This means that a hold time, i.e., a time period required for holding a data input signal after input of a clock signal, is further increased by the setup delay time. That is, after rising of the clock signal CK1, the period of the setup delay time is added to the hold time to preclude a logic level of the data input signal from being changed. This will be a new penalty on timing.

Differently, in the timing configuration where a delay time is set at only the timings of the falling edge of the clock signal CK3 and the rising edge of the inversed clock signal CKB3 without setting at the rising edge of the clock signal CK3 and the falling edge of the inversed clock signal CKB3, as in this embodiment, data in the second storage node (which receives the clock signal CK3 and the inversed clock signal CKB3) is latched at a timing when the first storage node (which receives the clock signal CK1 and the inversed clock signal CKB1) latches data. This makes it possible to prevent the hold time from being further extended due to the delay time set up in the clock. Thus, the SEE tolerant can be improved without deterioration in response characteristics.

Preferably, the clock delay time is maximized without exerting adverse effects on a clock operation. Specifically, the delay time is preferably set at 0.5 nsec or more, more preferably 0.9 nsec or more, particularly preferably 5 nsec or more. However, an excessively increased delay time will cause difficulty in defining the border with a subsequent clock to hinder a clock operation. Thus, an upper limit of the delay time is essentially set to be less than one-half of one cycle of the clock signals.

[Operation of Data Latch Circuit 6]

With reference to the circuit diagram in FIG. 11 and the timing chart in FIG. 17, the operation of the data latch circuit 6 will be described below. The timings between respective clock signals in FIG. 17 can be tabularized as the following Table 3. In Table 3, the period B corresponds to a time period of the through mode, and the periods A, C correspond to a time period of the latch mode.

TABLE 3

| Clock Signal | Period | | |
| --- | --- | --- | --- |
|  | A | B | C |
| CKB1 | 1 | 1 | 0 |
| CK1 | 0 | 0 | 1 |
| CKB3 | 0 | 1 | 0 |
| CK3 | 1 | 0 | 1 |

The following description will be firstly made about the period A. In this period, the first storage node is in the through mode (the transmission gate (6S1) is in an ON state, and the clocked inverter 6I8 is in an OFF state), and the second storage node is in the latch mode (the transmission gate (6S2) is in an OFF state, and the clocked inverter 6I10 is in an ON state). In this state, the second storage node in the latch mode holds a logic state, and this logic state defines the entire output. Thus, the data latch circuit 6 is in the latch mode as a whole. Therefore, in the period A, even if the input data signal D is entered at an erroneous logic level due to the SET, no influence is exerted on an output of the data latch circuit 6 as long as the duration of the SET signal is less than the delay time set up in the clock.

Secondly, a state in the period B will be described. In the period B, the first storage node is in the through mode (the transmission gate (6S1) is in the ON state, and the clocked inverter 6I8 is in the OFF state), and the second storage node is also in the through mode (the transmission gate (6S2) is in an ON state, and the clocked inverter 6I10 is in an OFF state). Thus, the data latch circuit 6 is in the through mode as a whole. In this state, both the first and second storage nodes are in the through mode. Therefore, if the input data signal D is entered at an erroneous logic level due to the SET, it will be sent out as an output of the data latch circuit 6.

Thirdly, a state in the period C will be described. In the period C, the first storage node is in the latch mode (the transmission gate (6S1) is in an OFF state, and the clocked inverter 6I8 is in the ON state), and the second storage node is also in the latch mode (the transmission gate (6S2) is in the OFF state, and the clocked inverter 6I10 is in the ON state). Thus, the data latch circuit 6 is in the latch mode as a whole.

In the storage nodes composed of the dual-port inverter (6IP1) and the dual-port clocked inverter (6IP2), an output from one of the inverters is entered into the other inverter, and thereby data will be held therein.

In this state, even if the input data signal D is entered at an erroneous logic level due to the SET, no influence is exerted on an output of the data latch circuit 6 as long as the duration of the SET signal is less than the delay time set up in the clock. Further, even if an energetic particle penetrates through the transistor in either one of the storage nodes, the inverters of the dual-port inverter (6IP1) and the dual-port clocked inverter (6IP2) are double-structured to prevent the SEE, as mentioned in connection with the description about the operation of the dual-port inverter and the dual-port clocked inverter.

As above, when a SET signal is incorporated in an input data signal D or an input clock signal CK, the clock with the delay can prevent the SET signal from being entered into both the storage nodes at the same timing, as long as the duration of the SET signal is less than the delay time set up in the clock. This makes it possible to prevent a malfunction or error which otherwise occurred in the conventional data latch circuit.

[Flip-Flop Circuit 7]

Figure 14:
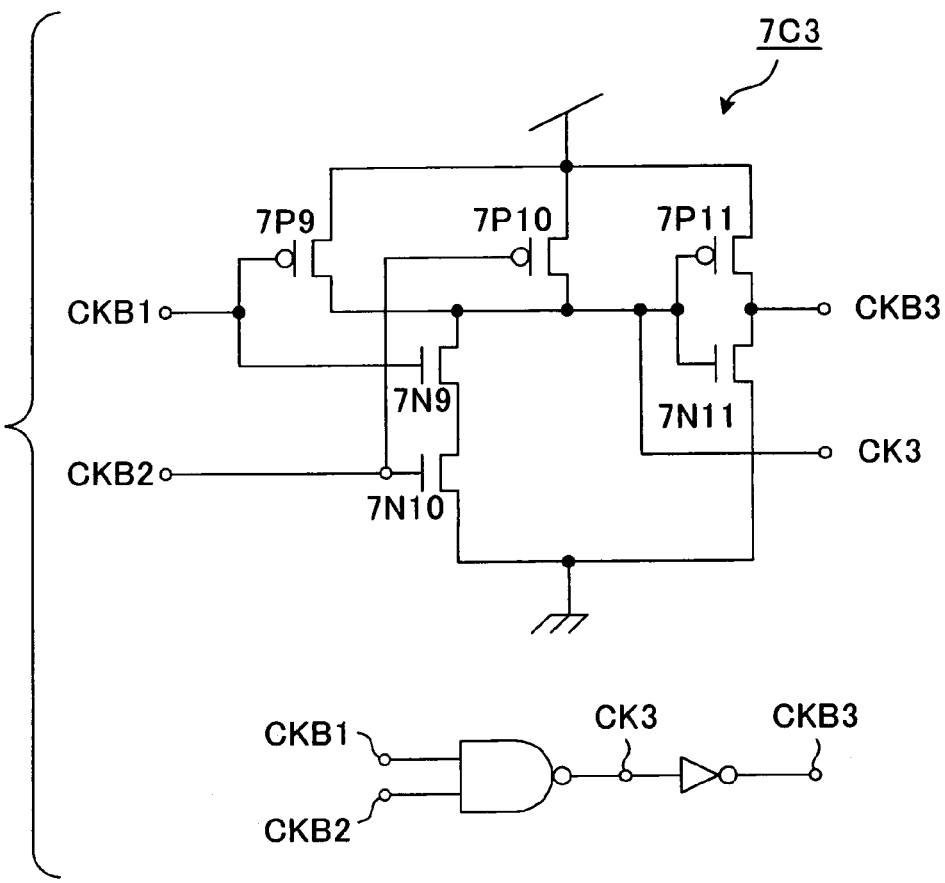
FIG. 14 is a circuit diagram showing a clock generation circuit 7C3 for the flip-flop circuit 7 according to the present invention.
Figure 15:
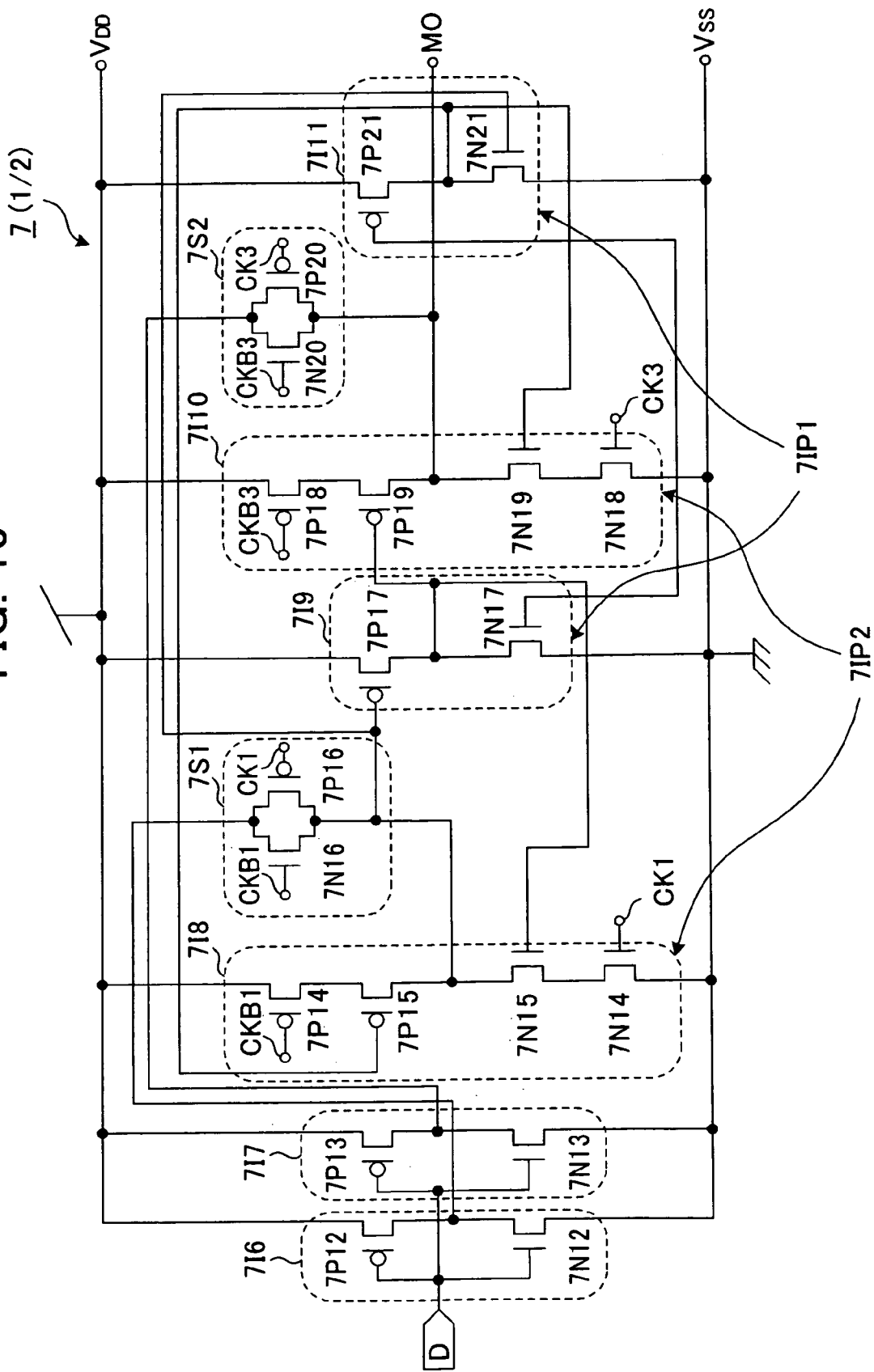
FIG. 15 is a circuit diagram showing the configuration of a master in a flip-flop circuit 7 which comprises dual-port inverters 7IP1, 7IP3 and dual-port clocked inverters 7IP2, 7IP4, according to a second embodiment of the present invention.
Figure 16:
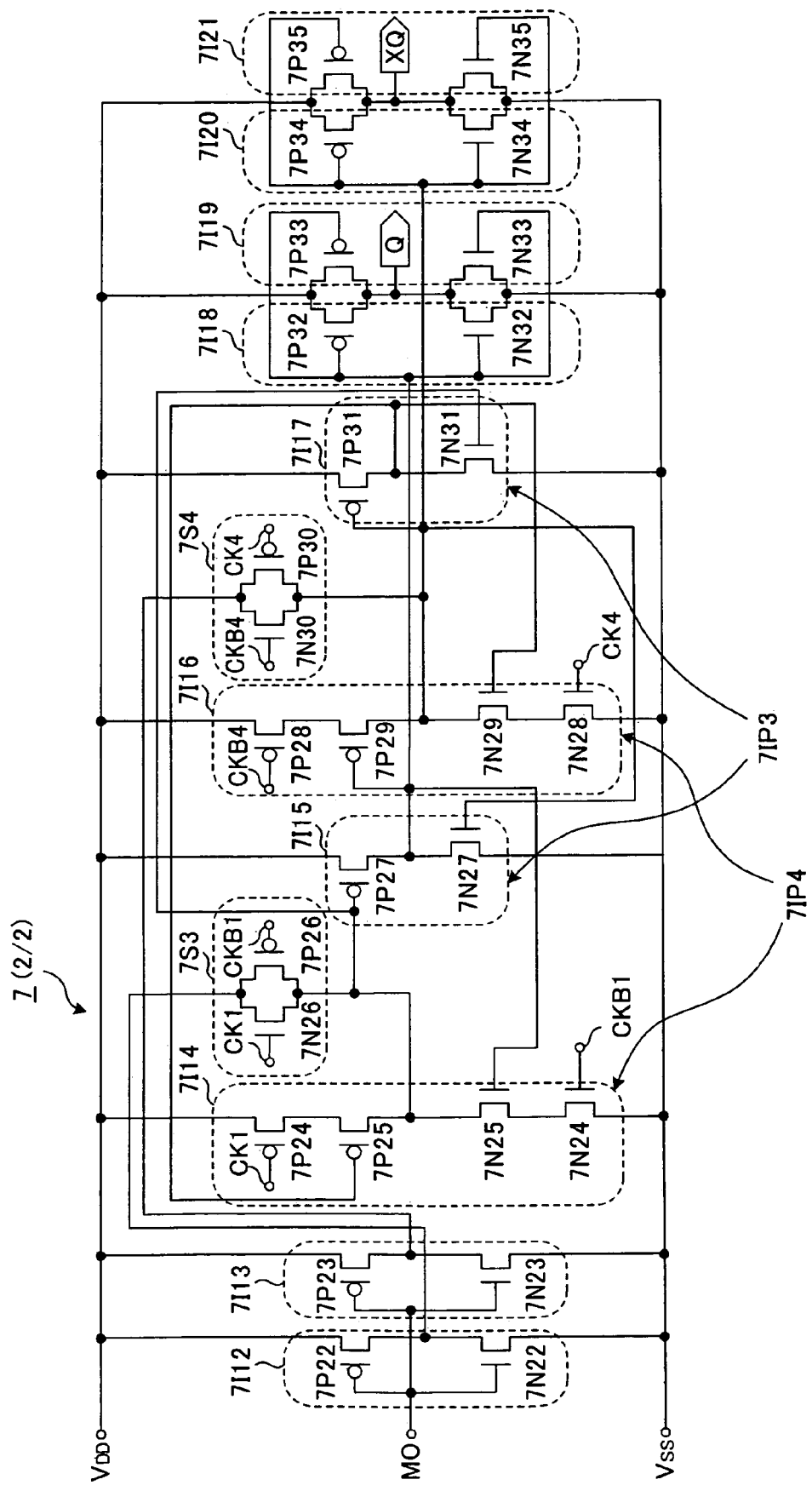
FIG. 16 is a circuit diagram showing the configuration of a slave in the flip-flop circuit 7 which comprises the dual-port inverters 7IP1, 7IP3 and the dual-port clocked inverters 7IP2, 7IP4, according to the second embodiment of the present invention.

With reference to the circuit diagrams (FIGS. 12 to 16) and the timing chart (FIG. 18), the configuration and operation of a flip-flop circuit 7 according to one embodiment of the present invention will be described below. FIGS. 15 and 16 are circuit diagrams showing the configuration of a flip-flop circuit 7 which comprises two dual-port inverters 7IP1, 7IP3 and two dual-port clocked inverters 7IP2, 7IP4, according to a second embodiment of the present invention. The flip-flop circuit 7 comprises a master which includes a dual-port inverter 7IP1 and a dual-port clocked inverter 7IP2, and a slave which includes a dual-port inverter 7IP3 and a dual-port clocked inverter 7IP4. The master is operable to receive an input data signal D and output an intermediate output signal MO to the slave, and the slave is operable to receive the intermediate output signal MO from the master and output an output data signal Q. FIG. 15 is a circuit diagram showing the master of the flip-flop circuit 7, and FIG. 16 is a circuit diagram showing the slave of the flip-flop circuit 7

[Configuration of Flip-Flop Circuit 7]

The flip-flop circuit 7 has a configuration comprising two dual-port inverters, and two dual-port clocked inverters including no transmission gate. Specifically, the flip-flop circuit 7 comprises: a first dual-port inverter (7IP1) having two input nodes for receiving a first pair of inputs, and two output nodes, wherein the first pair of inputs are coupled to the first dual-port inverter, respectively, via a first transmission gate (7SI) and a second transmission gate (7S2); a second dual-port clocked inverter (7IP3) having two input nodes coupled to the two output nodes of the first dual-port inverter (7IP1), and two output nodes; a first dual-port clocked inverter (7IP2) having two input nodes coupled to the two output nodes of the first dual-port inverter (7IP1), and two output nodes; a second dual-port inverter (7IP3) having two input nodes for receiving a second pair of inputs, and two output nodes, wherein the second pair of inputs are coupled to the second dual-port inverter, respectively, via a third transmission gate (7S3) and a fourth transmission gate (7S4); a second dual-port clocked inverter (7IP4) having two input nodes coupled to the two output nodes of the second dual-port inverter (7IP3), and two output nodes; and an output node connected to at least one of the two output nodes of the second dual-port inverter (7IP3) and the two output nodes of the second dual-port clocked inverter (7IP4). In the flip-flop circuit 7, the second pair of inputs coupled to the two input nodes of the second dual-port inverter (7IP3), respectively, via the third transmission gate (7S3) and the fourth transmission gate (7S4), are coupled to either the two output nodes of the first dual-port clocked inverter (7IP2). Each of the dual-port inverters (7IP1, 7IP3) has the same configuration as that of the aforementioned dual-port inverter 4, and each of the dual-port clocked inverters (7IP2, 7IP4)) has the same configuration as that of the aforementioned dual-port clocked inverter 5.

Each of the first dual-port inverter (7IP1) and the second dual-port inverter (7IP3) has the following configuration. The dual-port inverter comprises two inverters. Specifically, the first dual-port inverter (7IP1) includes a first inverter (7I9) and a second inverter (7I11), and the second dual-port inverter (7IP3) includes a third inverter (7I15) and a fourth inverter (7I17). Each of the inverters comprises a p-channel transistor and an n-channel transistor. Specifically, the first inverter (7I9) includes a 1st transistor (7P17) and a 2nd transistor (7N17) which are connected in series, and the second inverter (7I11) includes a 3rd transistor (7P21) and a 4th transistor (7N21) which are connected in series. Further, the third inverter (7II5) includes a 5th transistor (7P27) and a 6th transistor (7N27) which are connected in series, and the fourth inverter (7I17) includes a 7th transistor (7P31) and an 8th transistor (7N31) which are connected in series. The two inverters provide two input nodes. More specifically, a gate of the 1st transistor (7P17) is connected to a gate of the 4th transistor (7N21) to provide a first inverter input node, and a gate of the 2nd transistor (7N17) is connected to a gate of the 3rd transistor (7P21) to provide a second inverter input node. Further, a gate of the 5th transistor (7P27) is connected to a gate of the 8th transistor (7N31) to provide a third inverter input node, and a gate of the 6th transistor (7N27) is connected to a gate of the 7th transistor (7P31) to provide a fourth inverter input node. The two inverters further provide two output nodes. Specifically, the 1st and 2nd transistors (7P17, 7N17) provide a first inverter output node, and the 3rd and 4th transistors (7P21, 7N21) provide a second inverter output node. Further, the 5th and 6th transistors (7P27, 7N27) provide a third inverter output node, and the 7th and 8th transistors (7P31, 7N31) provide a fourth inverter output node. The two inverter input nodes are adapted to receive identical inputs. Specifically, the first and second inverter input nodes are adapted to receive identical inputs to provide a valid output at either the first inverter output node or the second inverter output node, and the third and fourth inverter input nodes are adapted to receive identical inputs to provide a valid output at either the third inverter output node or the fourth inverter output node. Each of the 1st and 3rd transistors (7P17, 7P21) is a p-channel transistor, and each of the 2nd and 4th transistors (7N17, 7N21) is an n-channel transistor. Each of the 5th and 7th transistors (7P27, 7P31) is a p-channel transistor, and each of the 6th and 8th transistors (7N27, 7N31) is an n-channel transistor.

Each of the dual-port clocked inverters comprises two clocked inverters. Specifically, the first dual-port clocked inverter (7IP2) includes a first clocked inverter (7I8) and a second clocked inverter (7I10), and the second dual-port clocked inverter (7IP4) includes a third clocked inverter (7I14) and a fourth clocked inverter (7I16). Each of the inverters comprises a p-channel transistor and an n-channel transistor. Specifically, the first clocked inverter (7I8) includes 9th, 10th, 11th and 12th transistors (7P14, 7P15, 7N15, 7N14) which connected in series in this order, and the second clocked inverter (7I10) includes 13th, 14th, 15th and 16th transistors (7P18, 7P19, 7N19, 7N18) which are connected in series in this order. Further, the third clocked inverter (7I14) includes 17th, 18th, 19th and 20th transistors (7P24, 7P25, 7N25, 7N24) which are connected in series in this order, and the fourth clocked inverter (7I16) includes 21st, 22nd, 23rd and 24th transistors (7P28, 7P29, 7N29, 7N28) which are connected in series in this order. The two clocked inverters provide two input nodes, and receive given complementary clock signals. Specifically, a gate of either one of the 9th and 10th transistors (7P14, 7P15) is connected to a gate of either one of the 15th and 16th transistors (7N19, 7N18) to provide a fifth inverter input node, and a gate of either one of the 11th and 12th transistors (7N15, 7N14) is connected to a gate of either one of the 13th and 14th transistors (7P18, 7P19) to provide a sixth inverter input node. Each of a gate of the other of the 9th and 10th transistors (7P14, 7P15) and a gate of the other of the 11th and 12th transistors (7N15, 7N14) is adapted to receive a different one of a pair of first complementary clock signals (CKB1, CK1) which are complementary to each other. Each of a gate of the other of the 13th and 14th transistors (7P18, 7P19) and a gate of the other of the 15th and 16th transistors (7N19, 6N18) is adapted to receive a different one of a pair of third complementary clock signals (CKB3, CK3) which are complementary to each other. Further, a gate of either one of the 17th and 18th transistors (7P24, 7P25) is connected to a gate of either one of the 23rd and 24th transistors (7N29, 7N28) to provide a seventh inverter input node, and a gate of either one of the 19th and 20th transistors (7N25, 7N24) is connected to a gate of either one of the 21st and 22nd transistors (7P28, 7P29) to provide an eighth inverter input node. Each of a gate of the other of the 17th and 18th transistors (7P24, 7P25) and a gate of the other of the 19th and 20th transistors (7N25, 7N24) is adapted to receive a different one of a pair of complementary clock signals having phases opposite to those of the first complementary clock signals. Each of a gate of the other of the 21st and 22nd transistors (7P28, 7P29) and a gate of the other of the 23rd and 24th transistors (7N29, 6N28) is adapted to receive a different one of a pair of fourth complementary clock signals (CKB4, CK4) which are complementary to each other. The first transmission gate (7S1) includes a p-channel transistor (7P16) and an n-channel transistor (7N16) each having a gate adapted to receive a different one of the first complementary clock signals with polarities allowing the first transmission gate to be subjected to an on/off operation opposite to that of the first clocked inverter (7I8). The second transmission gate (7S2) includes a p-channel transistor (7P20) and an n-channel transistor (7N20) each having a gate adapted to receive a different one of the third complementary clock signals with polarities allowing the second transmission gate to be subjected to an on/off operation opposite to that of the second clocked inverter (7I10). The third transmission gate (7S3) includes a p-channel transistor (7P26) and an n-channel transistor (7N26) each having a gate adapted to receive a different one of the first complementary clock signals with polarities allowing the third transmission gate to be subjected to an on/off operation opposite to that of the third clocked inverter (7I14). The fourth transmission gate (7S4) includes a p-channel transistor (7P30) and an n-channel transistor (7N30) each having a gate adapted to receive a different one of the fourth complementary clock signals with polarities allowing the fourth transmission gate to be subjected to an on/off operation opposite to that of the fourth clocked inverter (7I16).

In this embodiment, in the master, a node which receives the clock signal CK1 and the inversed clock signal CKB1 will be referred to as "first storage node", and a node which receives the clock signal CK3 and the inversed clock signal CKB3 will be referred to as "second storage node". Further, in the master, a node which receives the clock signal CK1 and the inversed clock signal CKB1 will be referred to as "first storage node", and a node which receives the clock signal CK4 and the inversed clock signal CKB4 will be referred to as "second storage node". The two clocked inverters provide two output nodes. Specifically, the 9th, 10th, 11th and 12th transistors (7P14, 7P15, 7N15, 7N14) provide a fifth inverter output node, and the 13th, 14th, 15th and 16th transistors (7P18, 7P19, 7N19, 7N18) provide a sixth inverter output node. Further, the 17th, 18th, 19th and 20th transistors (7P24, 7P25, 7N25, 7N24) provide a seventh inverter output node, and the 21st, 22nd, 23rd and 24th transistors (7P28, 7P29, 7N29, 7N28) provide an eighth inverter output node. The two inverter input nodes are adapted to receive identical inputs. Specifically, the fifth and sixth inverter input nodes are adapted to receive identical inputs to provide a valid output at either the fifth inverter output node or the sixth inverter output node, and the seventh and eighth inverter input nodes are adapted to receive identical inputs to provide a valid output at either the seventh inverter output node or the eighth inverter output node. Each of the 9th, 10th, 13th and 14th transistors (7P14, 7P15, 7P18, 7P19) is a p-channel transistor, and the 11th, 12th, 15th and 16th transistors (7N15, 7N14, 7N19, 7N18) is an n-channel transistor. Further, each of the 17th, 18th, 21st and 22nd transistors (7P24, 7P25, 7P28, 7P29) is a p-channel transistor, and the 19th, 20th, 23rd and 24th transistors (7N25, 7N24, 7N29, 7N28) is an n-channel transistor.

In this manner, each of the inverters is double-structured to suppress malfunctions due to the SEE. While a combination of a dual-port inverter and a transmission gate can theoretically perform the same operation as that of a dual-port clocked inverter, a circuit configuration based on such a combination of a (dual-port) inverter and a transmission gate has an disadvantage that a strong electric field region is likely to be widely generated depending on a source/drain voltage level even when an transistor of the transmission gate is in an ON state, to cause susceptibility to the SEE. In a clocked inverter used as substitute for the above combination, as in the present invention, the strong electric field region can be reduced as compared with the inverter using a transmission gate to effectively obtained enhanced insusceptibility to the SEE.

Preferably, two parallel-connected inverters are additionally provided in an input stage of the flip-flop circuit 7. Specifically, the flip-flop circuit 7 further includes a fifth inverter (7I6), and a sixth inverter (7I7) having an input node interconnected to an input node of the fifth inverter. The fifth inverter (7I6) has an output node connected to the first inverter input node via the first transmission gate (7S1), and the sixth inverter (7I7) has an output node connected to the second inverter input node via the second transmission gate (7S2). Preferably, two parallel-connected inverters are additionally provided in an intermediate stage of the flip-flop circuit 7. Specifically, the flip-flop circuit 7 further includes a seventh inverter (7I12), and an eighth inverter (7I13) having an input node interconnected to an input node of the seventh inverter. The seventh inverter (7I12) has an output node connected to the third inverter input node via the third transmission gate (7S3), and the eighth inverter (7I13) has an output node connected to the fourth inverter input node via the fourth transmission gate (7S4).

[Restriction on Distance between Gates]

For the reasons described in connection with the aforementioned data latch circuit 6, it is desirable to arrange the transistors of the flip-flop circuit 7 in spaced-apart relation to each other. Specifically, the flip-flop circuit 7 is preferably designed such that, in each combination of the inverter and the clocked inverter each one of which has an output node directly connected to an input node of the other, a diagonal distance from each of the p-channel and n-channel transistors included in the inverter to each of the n-channel and p-channel transistors in the clocked inverter is set at a given separation distance greater than a minimum diagonal distance in a layout where the diagonal distance is minimized. In such a combination, each of the adjacent transistors different in conductivity type has the same on/off operation in a steady state, and thereby the transistors in an OFF state are likely to simultaneously malfunction. In the above arrangement, the pair of transistors which are likely to cause inversion of a logic state in the data latch circuit 6 when being simultaneously subjected to the SET are spaced apart from each other by a relatively large diagonal distance. This makes it possible to significantly lower the possibility that the pair of transistors are simultaneously inversed due to a single penetration of energetic particles.

Specifically, a distance between each successive two of the transistor 7P15, the transistor 7N17, the transistor 7P19 and the transistor 7N21, a distance between each successive two of the transistor 7N15, the transistor 7P17, the transistor 7N19 and the transistor 7P21, a distan between each successive two of the transistor 7P25, the transistor 7N27, the transistor 7P29 and the transistor 7N31, and a distance between each successive two of the transistor 7N25, the transistor 7P27, the transistor 7N29 and the transistor 7P31, are preferably set at a given separation distance or more. A larger separation distance provides more enhanced SEE tolerance. More specifically, depending on a production process, a carrier density of a substrate and other factor, a desirable result could be obtained by setting the separation distance, for example, at 2.0 µm (micrometers) or more, or 2.9 µm or more.

[Clock Generation Circuit]

The following description will be made about a clock generation circuit. Each of a clock generation circuit 7C1 in FIG. 12, a clock generation circuit 7C2 in FIG. 13 and a clock generation circuit 7C3 in FIG. 14, is used in combination with the flip-flop circuit 7 to generate the clock signals CK1, CKB1, CK3, CKB3, CK3, CKB3 to be entered into the flip-flop circuit 7. FIG. 18 is a timing chart showing the clock signals for use in the flip-flop circuit 7.

Figure 12:
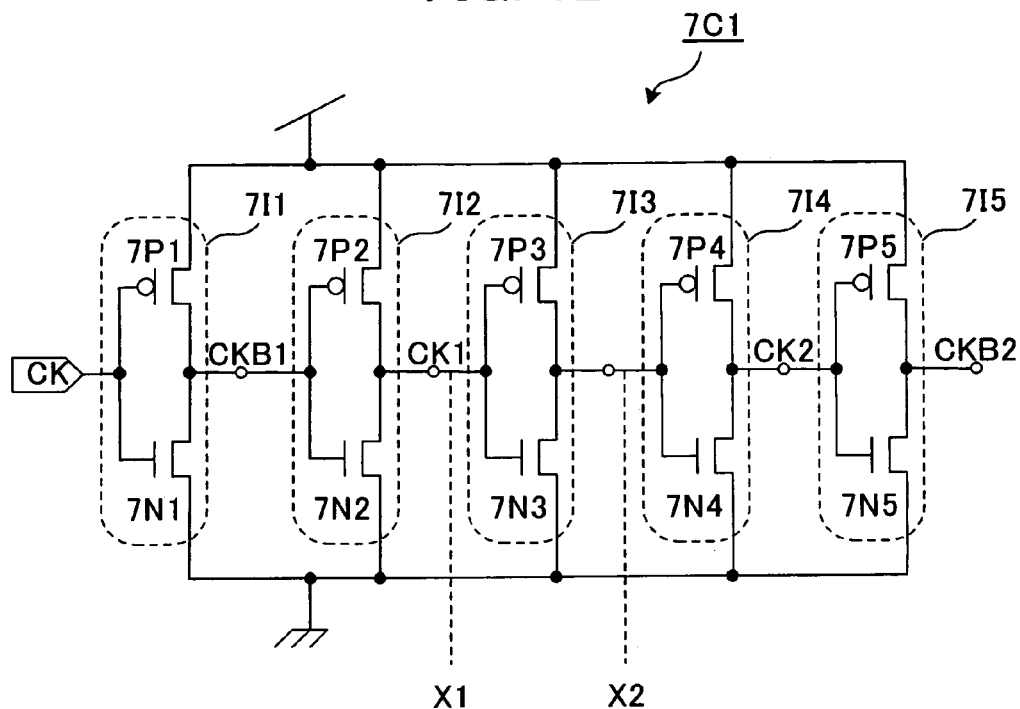
FIG. 12 is a circuit diagram showing a clock generation circuit 7C1 for a flip-flop circuit 7 according to the present invention.
Figure 13:
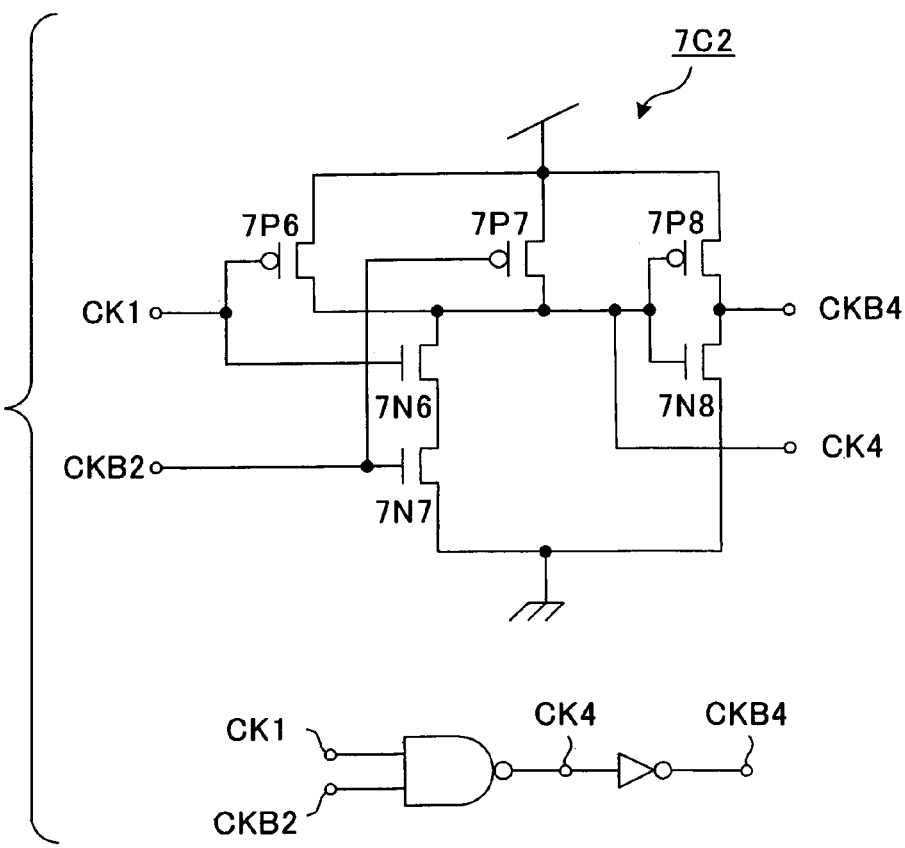
FIG. 13 is a circuit diagram showing a clock generation circuit 7C2 for the flip-flop circuit 7 according to the present invention.

As shown in FIG. 12, the clock generation circuit 7C1 is formed by connecting five inverters (7I1, 7I2, 7I3, 7I4, 7I5) in series. The clock generation circuit 7C1 is operable, based on an input clock signal CK entered thereinto, to generate an inversed clock signal CKB1, a clock signal CK1, a clock signal CK2 and an inversed clock signal CKB2. The clock generation circuit 7C1 has the same configuration as that of the clock generation circuit 7C1 illustrated in FIG. 9. FIG. 18 shows the timing of these clock signals. The timing of the clock signal CK2 and the inversed clock signal CKB2 is totally delayed by a time period indicated by "delay time" in FIG. 18.

A trailing-edge delayed clock (clock signal CK4 and inversed clock signal CKB4) to be entered into one of two storage nodes in the slave is generated by subjecting a normal clock and a totally-delayed clock to a calculation using a given logic circuit. For example, the clock generation circuit 7C2 serving as such a logic circuit may be formed as a combination of an inverter and a transistor as shown in an upper portion of FIG. 13, to realize a logic circuit as shown in a lower portion of FIG. 13. The clock generation circuit 7C2 has the same configuration as that of the clock generation circuit 6C2 illustrated in FIG. 10. The clock signal CK1 and the inversed clock signal CKB2 are entered into the clock generation circuit 7C2, and subjected to a NAND operation to generate the clock signal CK4. Then, the clock signal CK4 is inversed by the inverter to generate the inversed clock signal CKB4.

A leading-edge delayed clock (clock signal CK3 and inversed clock signal CKB3) to be entered into one of two storage nodes in the master is generated by subjecting a normal clock and a totally-delayed clock to a calculation using a given logic circuit. For example, the clock generation circuit 7C3 serving as such a logic circuit may be formed as a combination of an inverter and a transistor as shown in an upper portion of FIG. 14, to realize a logic circuit as shown in a lower portion of FIG. 14. The clock generation circuit 7C3 has the same configuration as that of the clock generation circuit 6C2 illustrated in FIG. 10. The inversed clock signal CKB1 and the inversed clock signal CKB2 are entered into the clock generation circuit 7C3, and subjected to a NAND operation to generate the clock signal CK3. Then, the clock signal CK3 is inversed by the inverter to generate the inversed clock signal CKB3.

The combination of the clock generation circuit 7C1, the clock generation circuit 7C2 and the clock generation circuit 7C3, can provide a clock signal having the following feature. Referring to FIG. 18, this combination is designed to generate a leading-edge delayed clock to be entered into one (second storage node) of two storage nodes in the master so as to delay a timing of shifting the storage node and the master from a latch mode to a through mode. In this specification, an edge of the clock corresponding to a timing when the storage node in the master is shifted from the latch mode to the through mode will be referred to as "leading edge". Specifically, a falling edge of a negative-phase signal (CKB3) in the third complementary clock signals which is adapted, when it is at a high level, to have a polarity allowing the second transmission gate (7S2) to be in an ON state, is set at the same timing as that of a falling edge of a negative-phase signal (CKB1) in the first complementary clock signals which is adapted, when it is at a high level, to have a polarity allowing the first transmission gate (6S1) to be in an ON state. Further, a rising edge, i.e., leading edge, of the negative-phase signal (CKB3) in the third complementary clock signals, is set at a delayed timing having a given delay time relative to a rising edge of the negative-phase signal (CKB1) in the first complementary clock signals. Furthermore, the above combination is designed to generate a trailing-edge advanced clock to be entered into one (second storage node) of two storage nodes in the slave so as to advance a timing of shifting the storage node and the slave from the through mode to the latch mode. In this specification, an edge of the clock corresponding to a timing when the storage node in the slave is shifted from the latch mode to the through mode will be referred to as "trailing edge". Specifically, a rising edge of a negative-phase signal (CKB4) in the fourth complementary clock signals which is adapted, when it is at a high level, to have a polarity allowing the fourth transmission gate (7S4) to be in an ON state, is set at the same timing as that of the falling edge of the negative-phase signal (CKB1) in the first complementary clock signals which is adapted, when it is at the high level, to have a polarity allowing the first transmission gate (6S1) to be in the ON state. Further, a falling edge, i.e., trailing edge, of the negative-phase signal (CKB4) in the fourth complementary clock signals, is set at an advanced timing earlier than a subsequent rising edge of the negative-phase signal (CKB1) in the first complementary clock signals. Furthermore, preferably, the falling edge of the negative-phase signal (CKB4) in the fourth complementary clock signals is set at a timing just after the above given delay time has elapsed from the rising edge of the negative-phase signal (CKB4) in said fourth complementary clock signals. The clock signal CK2 and the inversed clock signal CKB2 are intermediate signals for use in generating the clock signal CK3, the inversed clock signal CKB3, the clock signal CK4 and the inversed clock signal CKB4 which are to be entered into the flip-flop circuit 7. The relationship between major ones of the clock signals is shown in FIG. 18. While the timing of the falling edge, i.e., leading edge, of the clock signal CK3, is delayed from the falling edge of the clock signal CK1 by the given delay time, respective rising edges of these two clock signals are set at the same timing. While the rising edge, i.e., leading edge, of the inversed clock signal CKB3, is delayed from the rising edge of the inversed clock signal CKB1 by the given delay time, respective falling edges of these two clock signals are set at the same timing. Further, the rising edge of the inversed clock signal CKB4 is set at the same timing of the rising edge of the clock signal CK1. Furthermore, the falling edge, i.e., trailing edge, of the inversed clock signal CKB4 is set at an advanced timing earlier than the falling edge of the clock signal CK1 and just after the above given delay time has elapsed from the rising edge of the negative-phase signal CKB4.

The positive-phase signal (CK3) and the negative-phase signal (CKB3) in the third complementary clock signals are generated, respectively, by a NAND operation and an AND operation of the negative-phase signal (CKB1) in the first complementary clock signals (CK1, CKB1) and the negative-phase signal (CKB2) in the second complementary clock signals (CK2, CKB2) which are generated by delaying the first complementary clock signals by the given delay time in its entirety.

The positive-phase signal (CK4) and the negative-phase signal (CKB4) in the fourth complementary clock signals are generated, respectively, by a NAND operation and an AND operation of the positive-phase signal (CK1) in the first complementary clock signals (CK1, CKB1) and the negative-phase signal (CKB2) in the second complementary clock signals (CK2, CKB2) which are generated by delaying the first complementary clock signals by the given delay time in its entirety.

Thus, two types of clock signals different in timing are entered into the master. Specifically, the clock signal CK1 and the inversed clock signal CKB1 are entered into the first transmission gate 7S1, and the clock signal CK3 and the inversed clock signal CKB3 are entered into the second transmission gate 7S2. Further, each of the clocked inverter 7I8 and the clocked inverter 7I0 in the dual-port clocked inverter 7IP2 is adapted to receive a different clock signal. Specifically, the clock signal CK1 and the inversed clock signal CKB1 are entered into the clocked inverter 7I8), and the clock signal CK3 and the inversed clock signal CKB3 are entered into the clocked inverter 7I10. In this manner, a specific operation in one of the double-structured circuits in the master adapted to receive the input data signal can be set at a different timing from that of the other circuit. In this case, two storage nodes are formed of respective halves having the same clock signal timing in the double-structured circuits, wherein one of the storage nodes which receives the clock signal CK1 and the inversed clock signal CKB1 is defined as a first storage node, and the other storage node which receives the clock signal CK3 and the inversed clock signal CKB3 is defined as a second storage node. Thus, even if an erroneous input data signal D is set thereto due to the SET when one of the storage nodes is in the through mode, data in the first and second storage nodes can be protected from being changed, in the period where mismatching between the clock signals of the first and second storage nodes is caused by the delay.

If the entire operational timing of either one of the double-structured circuits in the master is simply changed, a problem about increase in hold time will occur. Thus, as with the aforementioned data latch circuit 6, a delay time is set at only the timings of the leading edges of the clock signal CK3 and the inversed clock signal CKB3, i.e., the falling edge of the clock signal CK3 and the rising edge of the inversed clock signal CKB3, without setting at the rising edge of the clock signal CK3 and the falling edge of the inversed clock signal CKB3, so as to prevent the hold time from being increased.

Further, two types of clock signals different in timing are entered into the slave. Specifically, the clock signal CK1 and the inversed clock signal CKB1 are entered into the transmission gate 7S4, and the clock signal CK4 and the inversed clock signal CKB4 are entered into the transmission gate 7S4. Further, each of the clocked inverter 7I14 and the clocked inverter 7I16 in the dual-port clocked inverter 7IP4 is adapted to receive a different clock signal. In this manner, a specific operation in one of the double-structured circuits in the slave adapted to receive the intermediate output signal MO can be set at a different timing from that of the other circuit. In this case, two storage nodes are formed of respective halves having the same clock signal timing in the double-structured circuits, wherein one of the storage nodes which receives the clock signal CK1 and the inversed clock signal CKB1 is defined as a first storage node, and the other storage node which receives the clock signal CK4 and the inversed clock signal CKB4 is defined as a second storage node. Thus, even if an erroneous input data signal D due to the SET is sent thereto as the intermediate output signal MO, data in the first and second storage nodes can be protected from being changed, in the period where mismatching between the clock signals of the first and second storage nodes is caused by the delay.

If the entire operational timing of either one of the double-structured circuits in the slave is simply changed, a certain problem will occur. Referring to FIG. 18, data is latched immediately after the master is changed from the through mode to the latch mode. In this process, it is desirable to reduce a propagation delay time, i.e., a delay time between an input of the data to the slave and an output data signal Q sent out from the slave. However, if the entire operational timing of either one of the double-structured circuits in the slave is simply changed, for example, the entire operational timing of the inversed clock signal CKB4 is simply delayed relative to an operational timing of the clock signal CK1, the timing of shifting the slave from the latch mode to the through mode will be delayed by the delay time to cause increase in the entire propagation delay time. This will be a new penalty on timing.

Differently, in the timing configuration where, while the falling edge, i.e., trailing edge, of the inversed clock signal CKB4 is set at the advanced timing earlier than the falling edge of the clock signal CK1, the rising edge of the inversed clock signal CKB4 is set at the same timing of the rising edge of the clock signal CK1, as in this embodiment, the second storage node (which receives the clock signal CK4 and the inversed clock signal CKB4) of the slave is changed to the slave mode at a timing when the first storage node (which receives the clock signal CK1 and the inversed clock signal CKB1) of the slave. That is, the entire slave is changed to the through mode at the above timing. Thus, even if two types of clock signals are set at different timings, the above timing configuration makes it possible to prevent the propagation delay time from being further extended. Thus, the SEE tolerance can be improved without deterioration in response characteristics.

Preferably, the clock delay time is maximized without exerting adverse effects on a clock operation. Specifically, the delay time is preferably set at 0.5 nsec or more, more preferably 0.9 nsec or more, particularly preferably 5 nsec or more. However, an excessively increased delay time will cause difficulty in defining the border with a subsequent clock to hinder a clock operation. Thus, an upper limit of the delay time is essentially set to be less than one-half of one cycle of the clock signals.

[Operation of Flip-Flop Circuit 7]

With reference to the circuit diagrams in FIGS. 15 and 16 and the timing chart in FIG. 18, the operation of the flip-flop circuit 7 will be described below. The timings between respective clock signals in FIG. 18 can be tabularized as the following Table 4. In Table 4, the period B corresponds to a time period during which the master and the slave in the conventional flip-flop circuit are, respectively, in the through mode and in the latch node. The period C corresponds to a time period during which the master and the slave in the conventional flip-flop circuit are, respectively, in the latch mode and in the through node. The periods A, D correspond to a time period during which both the master and slave are in the latch mode.

TABLE 3

| Clock Signal | Period | | | |
|---|---|---|---|---|
| | A | B | C | D |
| CKB1 | 1 | 1 | 0 | 0 |
| CK1 | 0 | 0 | 1 | 1 |
| CKB3 | 0 | 1 | 0 | 0 |
| CK3 | 1 | 0 | 1 | 1 |
| CKB4 | 0 | 0 | 1 | 0 |
| CK4 | 1 | 1 | 0 | 1 |

The following description will be firstly made about the period A. In the period A, the first storage node in the master is in the through mode (the transmission gate 7S1 is in an ON state, and the clocked inverter 7I8 is in an OFF state), and the second storage node in the master is in the latch mode (the transmission gate 7S2 is in an OFF state, and the clocked inverter 7I10 is in an ON state). In this state, the second storage node in the latch mode holds a logic state, and this logic state defines the entire output. Thus, the master is in the latch mode as a whole. Therefore, in the period A, even if the input data signal D is entered at an erroneous logic level due to the SET, it is not entered into the master of the flip-flop circuit 7, and thereby the flip-flop circuit 7 never holds erroneous data as long as the duration of the SET signal is less than the delay time set up in the clock.

In the period A, both the first and second storage nodes in the slave are in the latch mode (both the transmission gates 7S3, 7S4 are in an OFF state, and both the clocked inverters 7I14, 7I18 are in an ON state), and the slave is in the latch mode as a whole. The slave sends out the output data signal Q and the inversed output data XQ as an output of the flip-flop circuit 7 irrespective of a logic state of the master.

Secondly, a state in the period B will be described. In the period B, both the first and second storage nodes in the master are in the through mode (both the transmission gates 7S1, 7S2 are in the ON state, and both the clocked inverters 7I8, 7I10 are in the OFF state), and the master is in the through mode as a whole. In this period, the flip-flop circuit 7 receives the input data signal D though the master.

In the period B, both the first and second storage nodes in the slave are in the latch mode (both the transmission gates 7S3, 7S4 are in the OFF state, and both the clocked inverters 7I14, 7I16 are in the ON state), and the slave is in the latch mode as a whole. The slave sends out the output data signal Q and the inversed output data XQ as an output of the flip-flop circuit 7 irrespective of a logic state of the master.

Thirdly, a state in the period C will be described. In the period C, both the first and second storage nodes in the master are in the latch mode (both the transmission gates 7S1, 7S2 are in the OFF state, and both the clocked inverters 7I8, 7I10 are in the ON state), and the master is in the latch mode as a whole. In this period, the master holds a logic state just before change to the period C.

In the period C, both the first and second storage nodes in the slave are in the through mode (both the transmission gates 7S3, 7S4 are in the ON state, and both the clocked inverters 7I14, 7I16 are in the OFF state), and the slave is in the through mode as a whole. The slave receives data held in the master as the intermediate output signal MO, and sends out the output data signal Q and the inversed output data XQ based on the intermediate output signal MO, as an output of the flip-flop circuit 7. During transition from the period B to the period C, while the master is changed from the through mode to the latch mode, the slave is simultaneously changed from the latch mode to the through mode. In this manner, the slave is changed to the through mode in conjunction with the change of the master to the latch mode. This makes it possible to delay one of the clock signals relative to the other clock signal without increasing a propagation delay time in the flip-flop circuit 7, so as to provide enhanced tolerance to the input data signal D and the input clock signal CK.

Lastly, a state in the period D will be described. In the period C, both the first and second storage nodes in the master are in the latch mode (both the transmission gates 7S1, 7S2 are in the OFF state, and both the clocked inverters 7I8, 7I10 are in the ON state), and the master is in the latch mode as a whole. In this period, the master holds a logic state just before change to the period C. In the period D, even if an erroneous logic level due to the SET is entered to the master as the input data signal D or the input clock signal CK, the logic level in the master is never erroneously inversed as long as the duration of the SET signal is less than the delay time set up in the clock. This makes it possible to prevent adverse effects of the SET.

In the period D, the first storage node in the slave is in the through mode (the transmission gate 7S3 is in the ON state, and the clocked inverter 7I14 is in the OFF state), and the second storage node in the slave is in the latch mode (the transmission gate 7S4 is in the OFF state, and the clocked inverter 7I16 is in the ON state). In this state, the second storage node in the slave holds a logic state, and this state defines the entire output. That is, the slave is in the latch mode as a whole. Thus, in the period D, even if an erroneous intermediate output signal is sent to the slave due to occurrence of the SEE in the master, no influence is exerted on the slave. In this manner, when the mode is changed to the period C, the slave receives an output from the master and immediately sends out the output. Then, in the subsequent period D, the slave is changed to the latch mode while maintaining the master in the latch mode, so as to further reliably hold data. In the period D, even if an erroneous logic level due to the SET is entered into the slave as the intermediate output signal MO or the input clock signal CK, the logic state in the slave is never erroneously inversed as long as the duration of the SET signal is less than the delay time set up in the clock. This makes it possible to prevent the flip-flop circuit 7 from holding erroneous data.

An advantageous embodiment of the present invention has been presented for purposes of illustration and description, but is not intended to limit the invention to such a specific embodiment. It is obvious to those skilled in the art that various changes and modifications may be made therein without departing from the spirit and scope thereof as set forth in appended claims.

What is claimed:

1. A single-event effect tolerant latch circuit comprising:
  a dual-port inverter (6IP1) having two input nodes for receiving a pair of inputs, and two output nodes, wherein said pair of inputs are coupled to said dual-port inverter, respectively, via a first transmission gate (6S1) and a second transmission gate (6S2);
  a dual-port clocked inverter (6IP2) having two input nodes coupled to the two output nodes of said dual-port inverter (6IP1), and two output nodes; and
  an output node connected to at least one of the two output nodes of said dual-port inverter (6IP1) and the two output nodes of said dual-port clocked inverter (6IP2), wherein
  said dual-port inverter (6IP1) includes a first inverter (6I9) and a second inverter (6I11);
  said first inverter (6I9) includes a 1st transistor (6P16) and a 2nd transistor (6N16) which are connected to each other in series;
  said second inverter (6I11) includes a 3rd transistor (6P20) and a 4th transistor (6N20) which are connected to each other in series;
  each of said 1st and 3rd transistors (6P16, 6P20) is a p-channel transistor;
  each of said 2nd and 4th transistors (6N16, 6N20) is an n-channel transistor;
  a gate of said 1st transistor (6P16) is connected to a gate of said 4th transistor (6N20) to provide a first inverter input node;
  a gate of said 2nd transistor (6N16) is connected to a gate of said 3rd transistor (6P20) to provide a second inverter input node;
  said 1st and 2nd transistors (6P16, 6N16) provide a first inverter output node;
  said 3rd and 4th transistors (6P20, 6N20) provide a second inverter output node;
  said first and second inverter input nodes are adapted to receive identical inputs to provide a valid output at either said first inverter output node or said second inverter output node;
  a third inverter (6I6); and
  a fourth inverter (6I7) having an input node interconnected to an input node of said third inverter,
  wherein:
    said third inverter (6I6) has an output node connected to said first inverter input node via said first transmission gate (6S1); and
    said fourth inverter (6I7) has an output node connected to said second inverter input node via said second transmission gate (6S2).

2. The single-event effect tolerant latch circuit as defined in claim 1, wherein said dual-port clocked inverter (6IP2) includes a first clocked inverter (6I8) and a second clocked inverter (6I10).

3. The single-event effect tolerant latch circuit as defined in claim 2, wherein:
  said first clocked inverter (6I8) includes 5th, 6th, 7th and 8th transistors (6P13, 6P14, 6N13, 6N14) which are connected in series in this order; and
  said second clocked inverter (6I10) includes 9th, 10th, 11th and 12th transistors (6P17, 6P18, 6N17, 6N18) which are connected in series in this order.

4. The single-event effect tolerant latch circuit as defined in claim 3, wherein:
  each of said 5th, 6th, 9th and 10th transistors (6P13, 6P14, 6P17, 6P18) is a p-channel transistor; and
  each of said 7th, 8th, 11th and 12th transistors (6N13, 6N14, 6N17, 6N18) is an n-channel transistor.

5. The single-event effect tolerant latch circuit as defined in claim 4, wherein:
  a gate of either one of said 5th and 6th transistors (6P13, 6P14) is connected to a gate of either one of said 11th and 12th transistors (6N17, 6N18) to provide a third inverter input node; and
  a gate of either one of said 7th and 8th transistors (6N13, 6N14) is connected to a gate of either one of said 9th and 10th transistors (6P17, 6P18) to provide a fourth inverter input node;
  each of a gate of the other of said 5th and 6th transistors (6P13, 6P14) and a gate of the other of said 7th and 8th transistors (6N13, 6N14) is adapted to receive a different one of a pair of first complementary clock signals (CKB1, CK1) being complementary to each other;
  each of a gate of the other of said 9th and 10th transistors (6P17, 6P18) and a gate of the other of said 11th and 12th transistors (6N17, 6N18) is adapted to receive a different one of a pair of third complementary clock signals (CKB3, CK3) being complementary to each other;
  said first transmission gate (6S1) includes a p-channel transistor (6P15) and an n-channel transistor (6N15) each having a gate adapted to receive a different one of said pair of first complementary clock signals with polarities allowing said first transmission gate to be subjected to an on/off operation opposite to that of said first clocked inverter (6I8); and
  said second transmission gate (6S2) includes a p-channel transistor (6P19) and an n-channel transistor (6N19) each having a gate adapted to receive a different one of said pair of third complementary clock signals with polarities allowing said second transmission gate to be subjected to an on/off operation opposite to that of said second clocked inverter (6I10).

6. The single-event effect tolerant latch circuit as defined in claim 5, wherein:
  said 5th, 6th, 7th and 8th transistors (6P13, 6P14, 6N13, 6N14) provide a third inverter output node; and
  said 9th, 10th, 11th and 12th transistors (6P17, 6P18, 6N17, 6N18) provide a fourth inverter output node.

7. The single-event effect tolerant latch circuit as defined in claim 6, wherein said third and fourth input nodes are adapted to receive identical inputs to provide a valid output at either said third inverter output node or said fourth inverter output node.

8. A single-event effect tolerant latch circuit comprising:
a dual-port inverter (6IP1) having two input nodes for receiving a pair of inputs, and two output nodes, wherein said pair of inputs are coupled to said dual-port inverter, respectively, via a first transmission gate (6S1) and a second transmission gate (6S2);
a dual-port clocked inverter (6IP2) having two input nodes coupled to the two output nodes of said dual-port inverter (6IP1), and two output nodes; and
an output node connected to at least one of the two output nodes of said dual-port inverter (6IP1) and the two output nodes of said dual-port clocked inverter (6IP2), wherein:
said dual-port inverter (6IP1) includes a first inverter (6I9) and a second inverter (6I11);
said first inverter (6I9) includes a 1st transistor (6P16) and a 2nd transistor (6N16) which are connected to each other in series;
said second inverter (6I11) includes a 3rd transistor (6P20) and a 4th transistor (6N20) which are connected to each other in series;
each of said 1st and 3rd transistors (6P16, 6P20) is a p-channel transistor;
each of said 2nd and 4th transistors (6N16, 6N20) is an n-channel transistor;
a gate of said 1st transistor (6P16) is connected to a gate of said 4th transistor (6N20) to provide a first inverter input node;
a gate of said 2nd transistor (6N16) is connected to a gate of said 3rd transistor (6P20) to provide a second inverter input node;
said 1st and 2nd transistors (6P16, 6N16) provide a first inverter output node;
said 3rd and 4th transistors (6P20, 6N20) provide a second inverter output node;
said first and second inverter input nodes are adapted to receive identical inputs to provide a valid output at either said first inverter output node or said second inverter output node;
said dual-port clocked inverter (6IP2) includes a first clocked inverter (6I8) and a second clocked inverter (6I10);
said first clocked inverter (6I8) includes 5th, 6th, 7th and 8th transistors (6P13, 6P14, 6N13, 6N14) which are connected in series in this order;
said second clocked inverter (6I10) includes 9th, 10th, 11th and 12th transistors (6P17, 6P18, 6N17, 6N18) which are connected in series in this order;
each of said 5th, 6th, 9th and 10th transistors (6P13, 6P14, 6P17, 6P18) is a p-channel transistor;
each of said 7th, 8th, 11th and 12th transistors (6N13, 6N14, 6N17, 6N18) is an n-channel transistor;
a gate of either one of said 5th and 6th transistors (6P13, 6P14) is connected to a gate of either one of said 11th and 12th transistors (6N17, 6N18) to provide a third inverter input node;
a gate of either one of said 7th and 8th transistors (6N13, 6N14) is connected to a gate of either one of said 9th and 10th transistors (6P17, 6P18) to provide a fourth inverter input node;
each of a gate of the other of said 5th and 6th transistors (6P13, 6P14) and a gate of the other of said 7th and 8th transistors (6N13, 6N14) is adapted to receive a different one of a pair of first complementary clock signals (CKB1, CK1) being complementary to each other;
each of a gate of the other of said 9th and 10th transistors (6P17, 6P18) and a gate of the other of said 11th and 12th transistors (6N17, 6N18) is adapted to receive a different one of a pair of third complementary clock signals (CKB3, CK3) being complementary to each other;
said first transmission gate (6S1) includes a p-channel transistor (6P15) and an n-channel transistor (6N15) each having a gate adapted to receive a different one of said pair of first complementary clock signals with polarities allowing said first transmission gate to be subjected to an on/off operation opposite to that of said first clocked inverter (6I8);
said second transmission gate (6S2) includes a p-channel transistor (6P19) and an n-channel transistor (6N19) each having a gate adapted to receive a different one of said pair of third complementary clock signals with polarities allowing said second transmission gate to be subjected to an on/off operation opposite to that of said second clocked inverter (6I10);
said 5th, 6th, 7th and 8th transistors (6P13, 6P14, 6N13, 6N14) provide a third inverter output node;
said 9th, 10th, 11th and 12th transistors (6P17, 6P18, 6N17, 6N18) provide a fourth inverter output node;
said third and fourth input nodes are adapted to receive identical inputs to provide a valid output at either said third inverter output node or said fourth inverter output node;
said third complementary clock signals include a positive-phase signal (CK3) adapted, when it is at a low level, to have a polarity allowing said second transmission gate (6S2) to be in an ON state;
a rising edge of said positive-phase signal (CK3) in said third complementary clock signals is set at the same timing as a rising edge of a positive-phase signal (CK1) in said first complementary clock signals which is adapted, when it is at a low level, to have a polarity allowing said first transmission gate to be in an ON state; and
a falling edge of the positive-phase signal (CK3) in said third complementary clock signals is set at a delayed timing having a given delay time relative to a falling edge of the positive-phase signal (CK1) in said first complementary clock signals.

9. The single-event effect tolerant latch circuit as defined in claim 8, wherein the positive-phase signal (CK3) and a negative-phase signal (CKB3) in said third complementary clock signals are generated, respectively, by a NAND operation and an AND operation of a negative-phase signal (CKB1) in said first complementary clock signals (CK1, CKB1) and a negative-phase signal (CKB2) in a pair of second complementary clock signals (CK2, CKB2) which are generated by delaying said first complementary clock signals by said given delay time.

10. The single-event effect tolerant latch circuit as defined in claim 8, wherein said given delay time is 0.5 nanoseconds or more, and less than one-half of one cycle of said first complementary clock signals and said third complementary clock signals.

11. The single-event effect tolerant latch circuit as defined in claim 8, wherein for each combination of the inverter and the clocked inverter each one of which has an output node directly connected to an input node of the other, a diagonal distance from each of a p-channel transistor and an n-channel transistor included in said inverter to each of an n-channel transistor and a p-channel transistor in said clocked inverter is a given separation distance greater than a minimum diagonal distance in a layout where said diagonal distance is minimized.

12. The single-event effect tolerant latch circuit as defined in claim 11, wherein said given separation distance is 2.0 micrometers or more.

13. A single-event effect tolerant flip-flop circuit comprising:
a first dual-port inverter (7IP1) having two input nodes for receiving a first pair of inputs, and two output nodes, wherein said first pair of inputs are coupled to said first dual-port inverter, respectively, via a first transmission gate (7S1) and a second transmission gate (7S2);
a first dual-port clocked inverter (7IP2) having two input nodes coupled to the two output nodes of said first dual-port inverter (7IP1), and two output nodes;
a second dual-port inverter (7IP3) having two input nodes for receiving a second pair of inputs, and two output nodes, wherein said second pair of inputs are coupled to said second dual-port inverter, respectively, via a third transmission gate (7S3) and a fourth transmission gate (7S4);
a second dual-port clocked inverter (7IP4) having two input nodes coupled to the two output nodes of said second dual-port inverter (7IP3), and two output nodes; and
an output node connected to at least one of the two output nodes of said second dual-port inverter (7IP3) and the two output nodes of said second dual-port clocked inverter (7IP4),
wherein said second pair of inputs coupled to the two input nodes of said second dual-port inverter (7IP3), respectively, via said third transmission gate (7S3) and said fourth transmission gate (7S4), are coupled to either the two output nodes of said first dual-port clocked inverter (7IP2).

14. The single-event effect tolerant flip-flop circuit as defined in claim 13, wherein:
said first dual-port inverter (7IP1) includes a first inverter (7I9) and a second inverter (7I11); and
said second dual-port inverter (7IP3) includes a third inverter (7I15) and a fourth inverter (7I17).

15. The single-event effect tolerant flip-flop circuit as defined in claim 14, wherein for each combination of the inverter and the clocked inverter each one of which has an output node directly connected to an input node of the other, a diagonal distance from each of a p-channel transistor and an n-channel transistor included in said inverter to each of an n-channel transistor and a p-channel transistor in said clocked inverter is a given separation distance greater than a minimum diagonal distance in a layout where said diagonal distance is minimized.

16. The single-event effect tolerant flip-flop circuit as defined in claim 15, wherein said given separation distance is 2.0 micrometers or more.

17. The single-event effect tolerant flip-flop circuit as defined in claim 14, wherein:
said first inverter (7I9) includes a 1st transistor (7P17) and a 2nd transistor (7N17) which are connected to each other in series;
said second inverter (7I11) includes a 3rd transistor (7P21) and a 4th transistor (7N21) which are connected to each other in series;
said third inverter (7I15) includes a 5th transistor (7P27) and a 6th transistor (7N27) which are connected to each other in series; and
said fourth inverter (7I17) includes a 7th transistor (7P31) and an 8th transistor (7N31) which are connected to each other in series.

18. The single-event effect tolerant flip-flop circuit as defined in claim 17, wherein:
each of said 1st and 3rd transistors (7P17, 7P21) is a p-channel transistor;
each of said 2nd and 4th transistors (7N17, 7N21) is an n-channel transistor,
each of said 5th and 7th transistors (7P27, 7P31) is a p-channel transistor; and
each of said 6th and 8th transistors (7N27, 7N31) is an n-channel transistor.

19. The single-event effect tolerant flip-flop circuit as defined in claim 17, wherein:
a gate of said 1st transistor (7P17) is connected to a gate of said 4th transistor (7N21) to provide a first inverter input node;
a gate of said 2nd transistor (7N17) is connected to a gate of said 3rd transistor (7P21) to provide a second inverter input node;
a gate of said 5th transistor (7P27) is connected to a gate of said 8th transistor (7N31) to provide a third inverter input node; and
a gate of said 6th transistor (7N27) is connected to a gate of said 7th transistor (7P31) to provide a fourth inverter input node.

20. The single-event effect tolerant flip-flop circuit as defined in claim 19, wherein:
said 1st and 2nd transistors (7P17, 7N17) provide a first inverter output node;
said 3rd and 4th transistors (7P21, 7N21) provide a second inverter output node;
said 5th and 6th transistors (7P27, 7N27) provide a third inverter output node; and
said 7th and 8th transistors (7P31, 7N31) provide a fourth inverter output node.

21. The single-event effect tolerant flip-flop circuit as defined in claim 20, wherein:
said first and second inverter input nodes are adapted to receive identical inputs to provide a valid output at either said first inverter output node or said second inverter output node; and
said third and fourth inverter input nodes are adapted to receive identical inputs to provide a valid output at either said third inverter output node or said fourth inverter output node.

22. The single-event effect tolerant flip-flop circuit as defined in claim 21, which further comprises:
a fifth inverter (7I6);
a sixth inverter (7I7) having an input node interconnected to an input node of said fifth inverter,
a seventh inverter (7I12); and
an eighth inverter (7I13) having an input node interconnected to an input node of said seventh inverter,
wherein:
said fifth inverter (7I6) has an output node connected to said first inverter input node via said first transmission gate (7S1);
said sixth inverter (7I7) has an output node connected to said second inverter input node via said second transmission gate (7S2);
said seventh inverter (7I12) has an output node connected to said third inverter input node via said third transmission gate (7S3); and
said eighth inverter (7I13) has an output node connected to said fourth inverter input node via said fourth transmission gate (7S4).

23. The single-event effect tolerant flip-flop circuit as defined in claim 22, wherein:

said first dual-port clocked inverter (7IP2) includes a first clocked inverter (7I8) and a second clocked inverter (7I10); and said second dual-port clocked inverter (7IP4) includes a third clocked inverter (7I14) and a fourth clocked inverter (7I16).

24. The single-event effect tolerant flip-flop circuit as defined in claim 23, wherein:

said first clocked inverter (7I8) includes 9th, 10th, 11th and 12th transistors (7P14, 7P15, 7N15, 7N14) which are connected in series in this order;

said second clocked inverter (7I10) includes 13th, 14th, 15th and 16th transistors (7P18, 7P19, 7N19, 7N18) which are connected in series in this order;

said third clocked inverter (7I14) includes 17th, 18th, 19th and 20th transistors (7P24, 7P25, 7N25, 7N24) which are connected in series in this order; and said fourth clocked inverter (7I16) includes 21st, 22nd, 23rd and 24th transistors (7P28, 7P29, 7N29, 7N28) which are connected in series in this order.

25. The single-event effect tolerant flip-flop circuit as defined in claim 24, wherein:

each of said 9th, 10th, 13th and 14th transistors (7P14, 7P15, 7P18, 7P19) is a p-channel transistor;

each of said 11th, 12th, 15th and 16th transistors (7N15, 7N14, 7N19, 7N18) is an n-channel transistor;

each of said 17th, 18th, 21st and 22nd transistors (7P24, 7P25, 7P28, 7P29) is a p-channel transistor; and each of said 19th, 20th, 23rd and 24th transistors (7N25, 7N24, 7N29, 7N28) is an n-channel transistor.

26. The single-event effect tolerant flip-flop circuit as defined in claim 25, wherein:

a gate of either one of said 9th and 10th transistors (7P14, 7P15) is connected to a gate of either one of said 15th and 16th transistors (7N19, 7N18) to provide a fifth inverter input node;

a gate of either one of said 11th and 12th transistors (7N15, 7N14) is connected to a gate of either one of said 13th and 14th transistors (7P18, 7P19) to provide a sixth inverter input node;

each of a gate of the other of said 9th and 10th transistors (7P14, 7P15) and a gate of the other of said 11th and 12th transistors (7N15, 7N14) is adapted to receive a different one of a pair of first complementary clock signals (CKB1, CK1) being complementary to each other;

each of a gate of the other of said 13th and 14th transistors (7P18, 7P19) and a gate of the other of said 15th and 16th transistors (7N19, 7N18) is adapted to receive a different one of a pair of third complementary clock signals (CKB3, CK3) being complementary to each other;

a gate of either one of said 17th and 18th transistors (7P24, 7P25) is connected to a gate of either one of said 23rd and 24th transistors (7N29, 7N28) to provide a seventh inverter input node;

a gate of either one of said 19th and 20th transistors (7N25, 7N24) is connected to a gate of either one of said 21st and 22nd transistors (7P28, 7P29) to provide an eighth inverter input node;

each of a gate of the other of said 17th and 18th transistors (7P24, 7P25) and a gate of the other of said 19th and 20th transistors (7N25, 7N24) is adapted to receive a different one of a pair of complementary clock signals having phases opposite to those of said first complementary clock signals;

each of a gate of the other of said 21st and 22nd transistors (7P28, 7P29) and a gate of the other of said 23rd and 24th transistors (7N29, 7N28) is adapted to receive a different one of a pair of fourth complementary clock signals (CKB4, CK4) being complementary to each other;

said first transmission gate (7S1) includes a p-channel transistor (7P16) and an n-channel transistor (7N16) each having a gate adapted to receive a different one of said pair of first complementary clock signals with polarities allowing said first transmission gate to be subjected to an on/off operation opposite to that of said first clocked inverter (7I8);

said second transmission gate (7S2) includes a p-channel transistor (7P20) and an n-channel transistor (7N20) each having a gate adapted to receive a different one of said pair of third complementary clock signals with polarities allowing said second transmission gate to be subjected to an on/off operation opposite to that of said second clocked inverter (7I10);

said third transmission gate (7S3) includes a p-channel transistor (7P26) and an n-channel transistor (7N26) each having a gate adapted to receive a different one of said pair of first complementary clock signals with polarities allowing said third transmission gate to be subjected to an on/off operation opposite to that of said third clocked inverter (7I14); and said fourth transmission gate (7S4) includes a p-channel transistor (7P30) and an n-channel transistor (7N30) each having a gate adapted to receive a different one of said pair of fourth complementary clock signals with polarities allowing said fourth transmission gate to be subjected to an on/off operation opposite to that of said fourth clocked inverter (7I16).

27. The single-event effect tolerant flip-flop circuit as defined in claim 26, wherein:

said 9th, 10th, 11th and 12th transistors (7P14, 7P15, 7N15, 7N14) provide a fifth inverter output node;

said 13th, 14th, 15th and 16th transistors (7P18, 7P19, 7N19, 7N18) provide a sixth inverter output node;

said 17th, 18th, 19th and 20th transistors (7P24, 7P25, 7N25, 7N24) provide a seventh inverter output node; and said 21st, 22nd, 23rd and 24th transistors (7P28, 7P29, 7N29, 7N28) provide an eighth inverter output node.

28. The single-event effect tolerant flip-flop circuit as defined in claim 27, wherein:

said fifth and sixth inverter input nodes are adapted to receive identical inputs to provide a valid output at either said fifth inverter output node or said sixth inverter output node; and said seventh and eighth inverter input nodes are adapted to receive identical inputs to provide a valid output at either said seventh inverter output node or said eighth inverter output node.

29. The single-event effect tolerant flip-flop circuit as defined in claim 26, wherein said third complementary clock signals include a negative-phase signal (CKB3) adapted, when it is at a high level, to have a polarity allowing said second transmission gate (7S2) to be in an ON state, wherein:

a falling edge of the negative-phase signal (CKB3) in said third complementary clock signals is set at the same timing as a falling edge of a negative-phase signal (CKB1) in said first complementary clock signals which is adapted, when it is at a high level, to have a polarity allowing said first transmission gate to be in an ON state; and a rising edge of the negative-phase signal (CKB3) in said third complementary clock signals is set at a delayed timing having a given delay time relative to a rising edge of the negative-phase signal (CKB1) in said first complementary clock signals.

30. The single-event effect tolerant flip-flop circuit as defined in claim 29, wherein a positive-phase signal (CK3) and the negative-phase signal (CKB3) in said third complementary clock signals are generated, respectively, by a NAND operation and an AND operation of the negative-phase signal (CKB1) in said first complementary clock signals (CK1, CKB1) and a negative-phase signal (CKB2) in a pair of second complementary clock signals (CK2, CKB2) which are generated by delaying said first complementary clock signals by said given delay time.

31. The single-event effect tolerant flip-flop circuit as defined in claim 30, wherein:
   said fourth complementary clock signals include a negative-phase signal (CKB4) adapted, when it is at a high level, to have a polarity allowing said fourth transmission gate (7S4) to be in an ON state, wherein:
   a rising edge of the negative-phase signal (CKB4) in said fourth complementary clock signals is set at the same timing as a falling edge of a negative-phase signal (CKB1) in said first complementary clock signals which is adapted, when it is at a high level, to have a polarity allowing said first transmission gate to be in an ON state; and
   a falling edge of the negative-phase signal (CKB4) in said fourth complementary clock signals is set at an advanced timing earlier than a subsequent rising edge of the negative-phase signal (CKB1) in said first complementary clock signals.

32. The single-event effect tolerant flip-flop circuit as defined in claim 31, wherein the falling edge of the negative-phase signal (CKB4) in said fourth complementary clock signals is set at a timing just after said given delay time has elapsed from the rising edge of the negative-phase signal (CKB4) in said fourth complementary clock signals.

33. The single-event effect tolerant flip-flop circuit as defined in claim 32, wherein a positive-phase signal (CK4) and the negative-phase signal (CKB4) in said fourth complementary clock signals are generated, respectively, by a NAND operation and an AND operation of a positive-phase signal (CK1) in said first complementary clock signals (CK1, CKB1) and a negative-phase signal (CKB2) in a pair of second complementary clock signals (CK2, CKB2) which are generated by delaying said first complementary clock signals by said given delay time.

34. The single-event effect tolerant flip-flop circuit as defined in claim 32, wherein said given delay time is 0.5 nanoseconds or more, and less than one-half of one cycle of said first complementary clock signals and said third complementary clock signals.

* * * * *